(12) United States Patent
Jiang et al.

(10) Patent No.: US 12,453,298 B2
(45) Date of Patent: *Oct. 21, 2025

(54) RESISTIVE RANDOM ACCESS MEMORY DEVICE

(71) Applicant: Taiwan Semiconductor Manufacturing Company, Ltd., Hsinchu (TW)

(72) Inventors: Jheng-Hong Jiang, Hsinchu (TW); Shing-Huang Wu, Hsinchu (TW); Chia-Wei Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 837 days.

This patent is subject to a terminal disclaimer.

(21) Appl. No.: 17/671,601

(22) Filed: Feb. 15, 2022

(65) Prior Publication Data

US 2022/0406999 A1 Dec. 22, 2022

Related U.S. Application Data

(60) Provisional application No. 63/212,591, filed on Jun. 18, 2021, provisional application No. 63/212,594, filed on Jun. 18, 2021.

(51) Int. Cl.
*H10N 70/00* (2023.01)
*H10B 63/00* (2023.01)

(52) U.S. Cl.
CPC ......... *H10N 70/8418* (2023.02); *H10B 63/30* (2023.02); *H10N 70/021* (2023.02)

(58) Field of Classification Search
CPC ............. H10N 70/8418; H10N 70/021; H10N 70/023; H10N 70/066; H10N 70/24; H10N 70/8416; H10N 70/8833; H10B 63/30

See application file for complete search history.

(56) References Cited

U.S. PATENT DOCUMENTS

| | | | |
|---|---|---|---|
| 8,895,953 B1* | 11/2014 | Shields | H10N 70/826 438/102 |
| 11,335,852 B2* | 5/2022 | Loy | H10N 70/011 |
| 2009/0321711 A1* | 12/2009 | Takagi | H10B 63/20 257/E47.001 |
| 2015/0021539 A1* | 1/2015 | Cai | H10N 70/20 257/4 |
| 2015/0357566 A1* | 12/2015 | Wang | H10N 70/841 257/4 |
| 2019/0288201 A1* | 9/2019 | Sun | H10N 70/24 |
| 2020/0411758 A1* | 12/2020 | Lin | H10N 70/826 |
| 2022/0069207 A1* | 3/2022 | McCrate | H10N 70/20 |
| 2022/0310910 A1* | 9/2022 | Hsu | H10N 70/823 |
| 2023/0140134 A1* | 5/2023 | Jiang | H10N 70/8416 257/4 |

* cited by examiner

*Primary Examiner* — Chad M Dicke
*Assistant Examiner* — Gary Abel
(74) *Attorney, Agent, or Firm* — KILPATRICK TOWNSEND & STOCKTON LLP

(57) ABSTRACT

A RRAM device is provided. The RRAM device includes: a bottom electrode in a first dielectric layer; a switching layer in a second dielectric layer over the first dielectric layer, wherein a conductive path is formed in the switching layer when a forming voltage is applied; and a tapered top electrode region in a third dielectric layer over the second dielectric layer, wherein the tapered top electrode region extends downwardly into the switching layer.

20 Claims, 21 Drawing Sheets

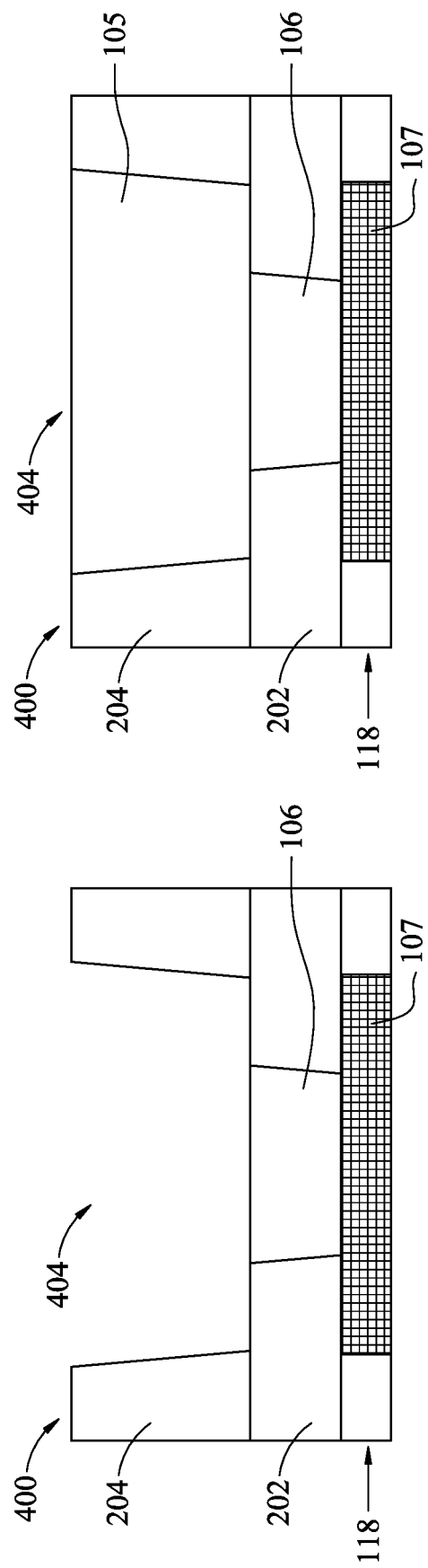

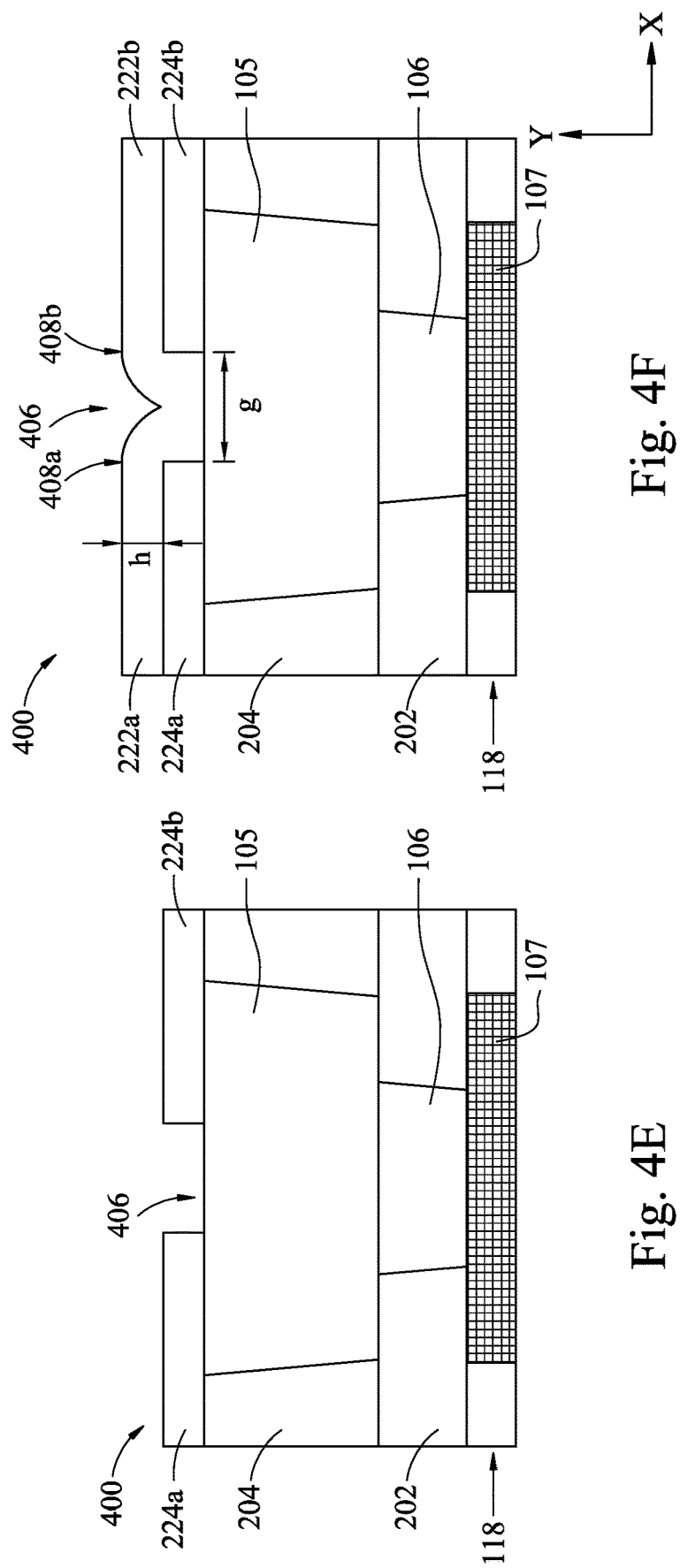

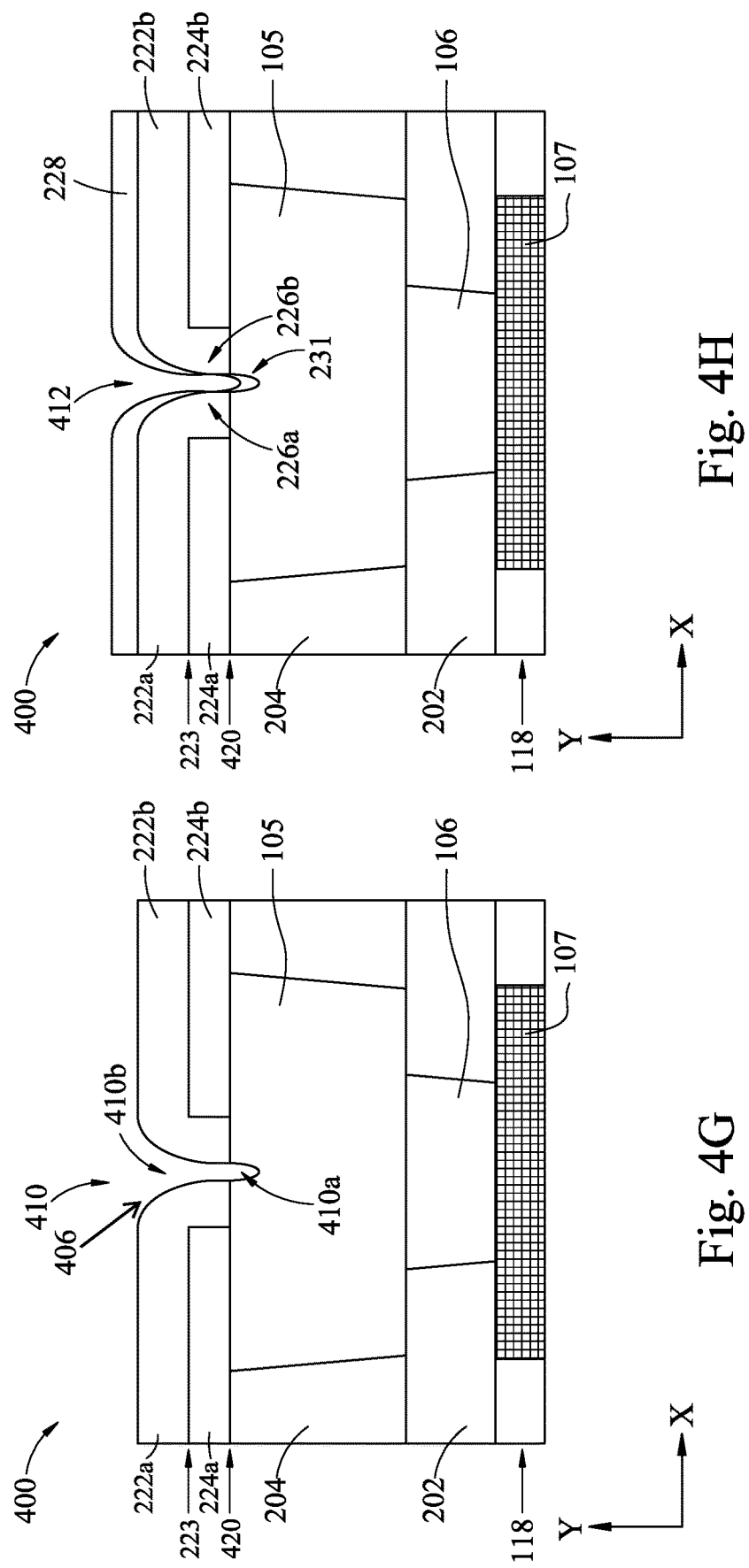

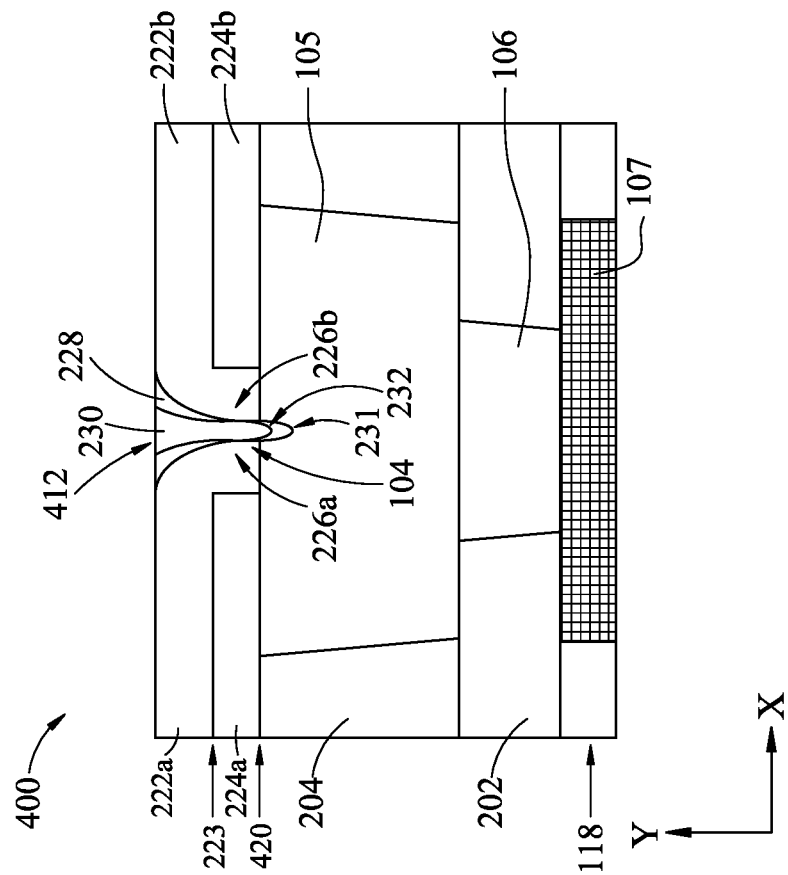
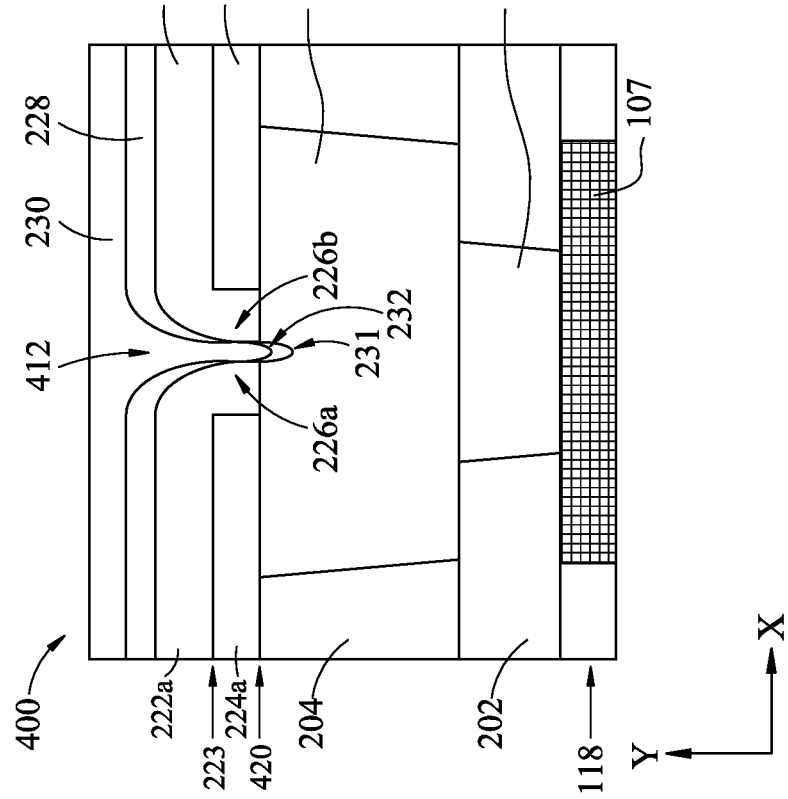
Fig. 4J
Fig. 4I

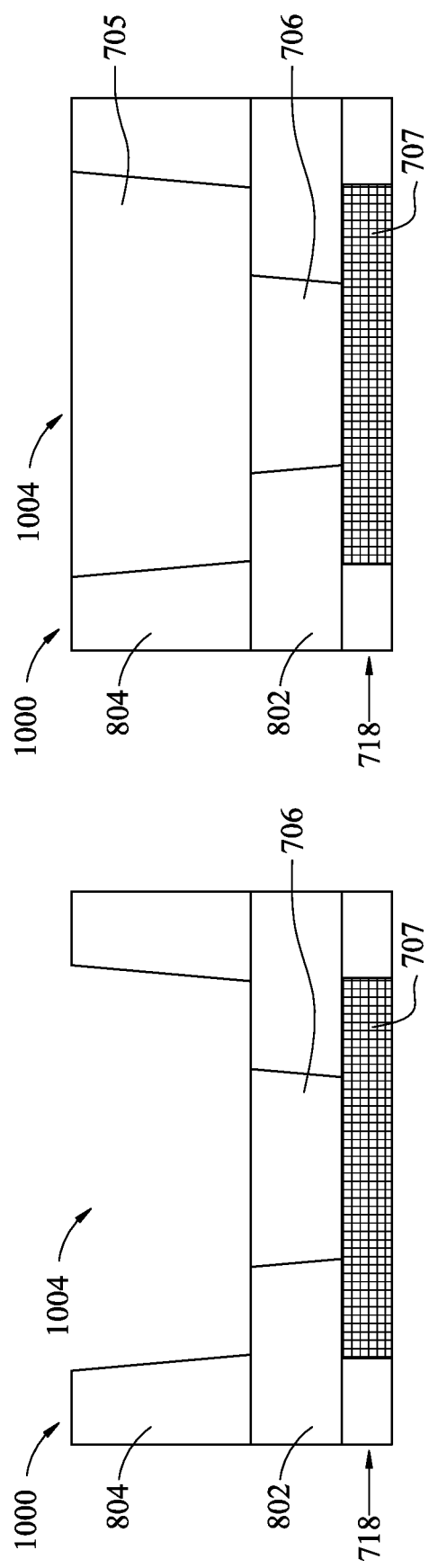

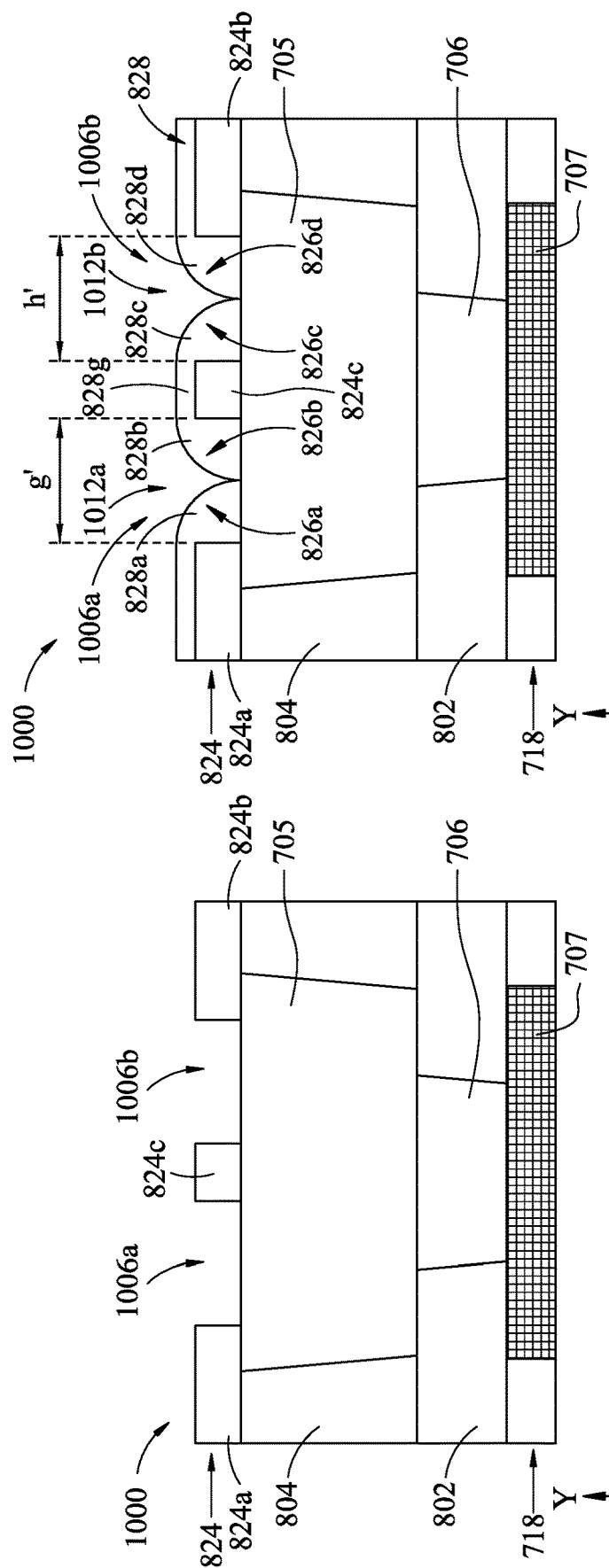

RESISTIVE RANDOM ACCESS MEMORY DEVICE

CROSS-REFERENCES TO RELATED APPLICATIONS

The present application claims priority to U.S. Provisional Patent Application No. 63/212,591, filed on Jun. 18, 2021, and U.S. Provisional Patent Application No. 63/212,594, filed on Jun. 18, 2021, the entire disclosure of which are incorporated herein by reference.

FIELD

Embodiments of the present disclosure relate generally to memory devices, and more particularly to resistive random access memory (RRAM) devices.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, and so on. Moreover, RRAM implementations could be very useful hardware for running artificial intelligence (AI) and machine learning (ML) applications due to the increasing computational demands necessary for many improvements in AI and ML.

Therefore, there is a need to improve the performance of RRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4K are diagrams illustrating cross-sectional views of an RRAM device at various fabrication stages in accordance with some embodiments.

FIGS. 10A-10I are diagrams illustrating cross-sectional views of an RRAM device at various fabrication stages in accordance with some embodiments.

DETAILED DESCRIPTION OF THE INVENTION

Figure 1:
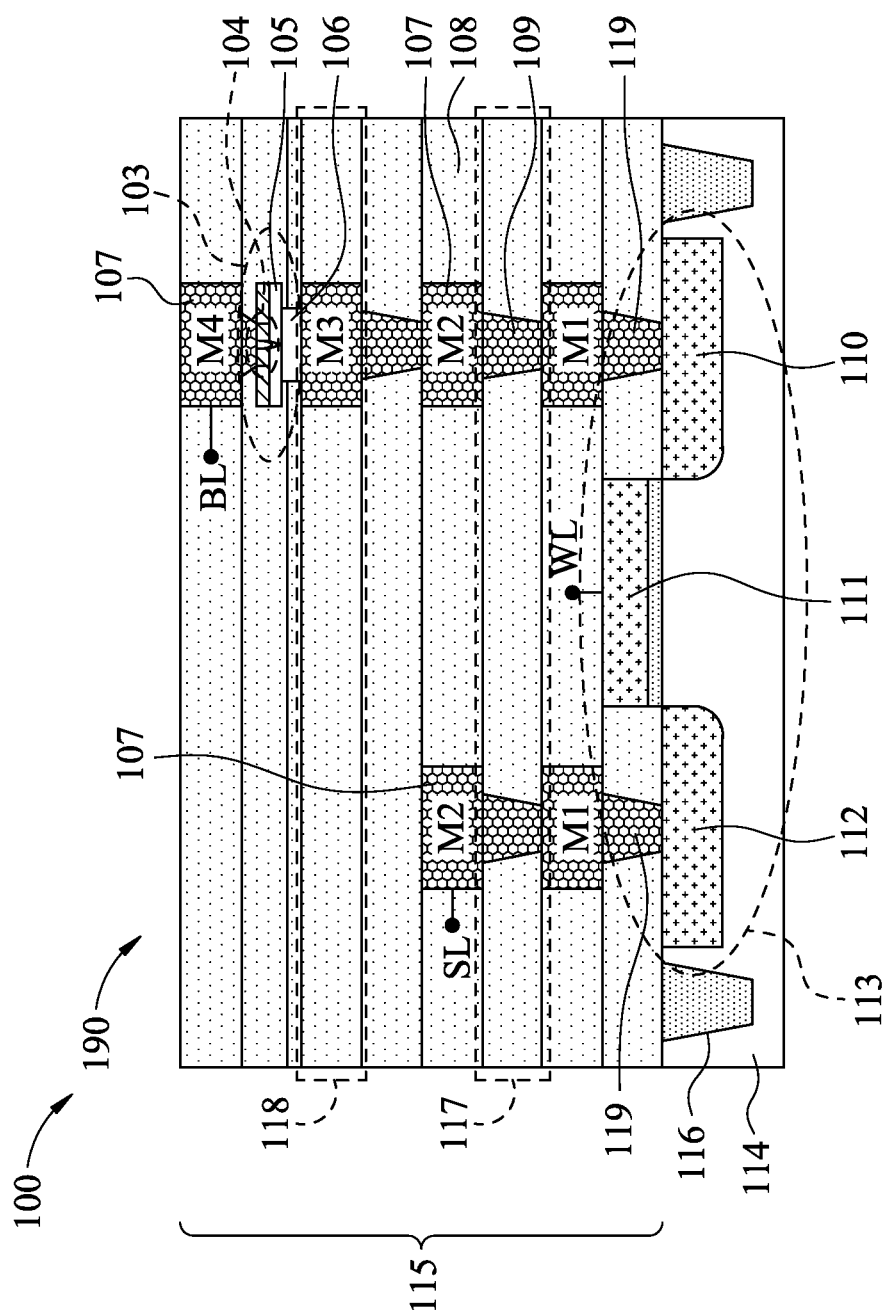
FIG. 1 is a diagram illustrating an example integrated circuit device including an RRAM device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Resistive random access memory (RRAM) is a type of nonvolatile memory (NVM) that works by changing the resistance across a dielectric solid-state material. RRAM devices are configured to store data by switching between different resistance states, for example, a high resistance state (HRS) and a low resistance state (LRS), corresponding to different data states.

To enable such "resistive switching," RRAM devices have a bottom electrode that is separated from a top electrode by a switching layer (sometimes referred to as a "data storage layer") having a variable resistance. The switching layer is a dielectric layer. Resistive switching allows for an RRAM device to change an electrical resistance of the switching layer between a high resistance state corresponding to a first data state (e.g., a "logic 0") and a low resistance state corresponding to a second data state (e.g., a "logic 1").

The switching layer typically comprises a high-κ dielectric material that is able to alter its internal resistance in response to an applied bias. There is a wide range of high-κ dielectric materials that can be used in RRAM devices. Different high-κ dielectric materials provide RRAM devices with different characteristics. For example, some high-κ dielectric materials may offer good endurance, while other high-κ dielectric materials may offer good data retention. Some examples of high-κ dielectric materials include metal oxides such as aluminum oxide ($Al_2O_3$).

When a sufficiently high voltage (often referred to as "$V_{forming}$") is applied to the switching layer, oxygen ions move out of the switching layer, and the remaining oxygen vacancies form a conductive path (often referred to as a "filament") in the switching layer. The filament serves as a bridge between the top electrode and the bottom electrode, thus placing the RRAM device in the low resistance state (LRS). Once a filament is formed, it can be broken (referred to as the "reset" operation), resulting in the high resistance state (HRS), or regenerated (referred to as the "set" operation), resulting in the low resistance state (LRS).

There are, however, some challenges with the conventional RRAM devices. First, the filament generated has a large variation. The top electrode and the bottom electrode usually have comparable sizes. As a result, the filament can possibly occur at various locations and have various geometries. In some cases, there may be multiple filaments in the switching layer. In other words, the filament is not very predictable and cannot be controlled easily. The unpredictability negatively impacts the endurance and data retention in an RRAM device.

Second, the number of oxygen ions in an RRAM device usually decreases after frequent resistive switching operations. The oxygen ions in an RRAM device also diffuse, over time, into other regions due to a gradient in concentration. As the number of oxygen ions decreases, it becomes harder to break the filament (i.e., harder to reset the RRAM device). Accordingly, the endurance of the RRAM device is impacted by the loss of oxygen ions, and the data retention of the RRAM device deteriorates, limiting its usage in high-performance applications.

Moreover, there are some desirable attributes of an RRAM device, including low power consumption and low process variation, among other attributes. Low power consumption makes an RRAM device less expensive to run on given battery technologies and able to function for longer. Also, with lower operation voltage and therefore less power consumption, there will be less heat dissipation.

Process variation is the naturally occurring variation in the attributes of transistors (length, width, oxide thickness, etc.) when an integrated circuit (IC) is fabricated. The amount of process variation becomes pronounced at smaller technology nodes as the variation becomes a larger percentage of the full length or width of the semiconductor devices and as feature sizes approach the fundamental dimensions such as the size of atoms and the wavelength of usable light for patterning lithography masks. Process variation causes measurable variance in the performance of semiconductor devices and the integrated circuits including those semiconductor devices, which may reduce the overall yield for those semiconductor devices. For RRAM devices, process variation may result in poor uniformity among different cells in a memory cell array or among chips in different batches, which may in turn cause situations such as over-writing, too-strong filaments.

Additionally, although RRAM devices have the advantage of much faster switching speed than technologies such as NAND flash memories, conventional RRAM devices are more expensive. Therefore, it is desirable to reduce the cost per bit of RRAM devices.

In accordance with some aspects of the disclosure, an improved top electrode and corresponding fabrication methods are introduced for addressing the aforementioned challenges resulted from the filament variations and the loss of oxygen ions. In some embodiment, a top electrode region is disposed in a dielectric layer and extends downwardly, in a vertical direction, into the switching layer below the dielectric layer. In other words, the top electrode region extends beyond the interface between the dielectric layer and the switching layer. The top electrode region includes an oxygen-rich dielectric layer and a top electrode over the oxygen-rich dielectric layer. The oxygen-rich dielectric layer has a tip below the interface between the dielectric layer and the switching layer. The top electrode also has a tip below the interface between the dielectric layer and the switching layer.

Due to the tapered shape of the top electrode region, a point discharge occurs when a filament is formed by applying a forming voltage to the top electrode. Since the tip has a large curvature, the electrical field around the tip is larger than that of a conventional top electrode, given the same voltage. As a result, it becomes easier to break down the switching layer to form the filament. The formation of the filament is more predictable and controllable. On the other hand, the oxygen-rich dielectric layer is a layer with a relatively high concentration of oxygen ions. In one embodiment, the oxygen-rich dielectric layer has a concentration of oxygen ions higher than a threshold concentration. As such, the oxygen-rich dielectric layer can have enough oxygen ions to compensate for the loss of oxygen ions after frequent switching operations. As a result, the endurance and data retention in the RRAM device is improved significantly.

Moreover, the distance between the tip of the top electrode and the bottom electrode becomes smaller because the tip is below the interface between the dielectric layer and the switching layer. As a result, the operation voltage to break down the switching layer (i.e., to form the filament) becomes smaller, therefore resulting in a lower power assumption. Lastly, the uniformity of the top electrode can be improved by dynamically adjusting parameters for depositing the oxygen-rich dielectric layer. The improved uniformity of the top electrode among different cells in a memory cell array or among chips in different batches can improve the endurance of the RRAM devices because situations such as over-writing, too-strong filaments can be avoided.

In accordance with other aspects of the disclosure, an improved top electrode and corresponding fabrication methods are introduced for addressing the aforementioned challenges resulted from the filament variations, the loss of oxygen ions, and the high cost per bit. In some embodiment, the RRAM device includes a bottom electrode, a switching layer, and two isolated top electrodes. The two isolated top electrodes are tapered, and each of them has a tip pointing toward the switching layer. Additionally, each of the two isolated top electrodes is deposited over an oxygen-rich dielectric layer, which has a concentration of oxygen ions higher than a threshold concentration. An isolation structure extends upward from a top surface of the switching layer and isolates the first tapered top electrode from the second tapered top electrode. As such, the RRAM device can be regarded as two RRAM devices that share the bottom electrode and the switching layer.

Due to the tapered shape of the top electrodes, a point discharge occurs when a filament is formed by applying a forming voltage to one of the isolated top electrodes. Since the tip has a large curvature, the electrical field around the tip is larger than that of a conventional top electrode, given the same voltage. As a result, it becomes easier to break down the switching layer to form the filament. The formation of the filament is more predictable and controllable. On the other hand, the oxygen-rich dielectric layer is a layer with a relatively high concentration of oxygen ions. In one embodiment, the oxygen-rich dielectric layer has a concentration of oxygen ions higher than a threshold concentration. As such, the oxygen-rich dielectric layer can have enough oxygen ions to compensate for the loss of oxygen ions after frequent switching operations. As a result, the endurance and data retention in the RRAM device is improved significantly. Moreover, since the RRAM device can be regarded as two RRAM devices that share the bottom electrode and the switching layer, the areal density has been increased by storing two bits of information instead of one bit of information.

FIG. 1 is a diagram illustrating an example integrated circuit device 100 including an RRAM device 103 in accordance with some embodiments. In the illustrated example, the integrated circuit device 100 includes an RRAM cell 190, which includes the RRAM device 103 and an access transistor 113. In other embodiments, an integrated circuit device includes multiple RRAM cells arranged in rows and columns. The RRAM device 103 includes a tapered top electrode region 104 instead of a conventional top electrode to address the aforementioned challenges resulted from the filament variations and the loss of oxygen ions. In some embodiments, the tapered top electrode region 104 is a needle-like-shaped top electrode region 104. It should be noted that a needle-like shape is one example of a tapered shape, though the terms "needle-like-shaped" and "tapered" may be used interchangeably in the disclosure. The RRAM device 103 also includes a bottom electrode 106 and a switching layer 105 between the bottom electrode 106 and the top electrode region 104. As explained above, the electrical resistance of the switching layer 105 can be changed between a high resistance state (HRS) and a low resistance state (LRS). Details of the structure of the RRAM device 103 will be described below with reference to FIG. 2, whereas details of the fabrication of the RRAM device 103 will be described below with reference to FIGS. 3-4L.

In the illustrated example, the integrated circuit device 100 includes an interconnect structure 115 formed over a substrate 114. The substrate 114 may be, for example, a bulk substrate (e.g., a bulk silicon substrate) or a silicon-on-insulator (SOI) substrate. In some examples, the substrate 114 may also be a binary semiconductor substrate (e.g., GaAs), a ternary semiconductor substrate (e.g., AlGaAs), or a higher order semiconductor substrate. In the illustrated example, the substrate 114 includes shallow trench isolation (STI) regions 116 formed by filling trenches in the substrate 114 with dielectric. The interconnect structure 115 includes a plurality of inter-level dielectric (ILD) layers 117 interleaved with metallization layers 118. In the illustrated example, the ILD layers 117 include vias 109. In some implementations, dielectric 108 is, for example, low-κ dielectric, such as undoped silicate glass or an oxide, such as silicon dioxide or silicon carbide. The dielectric 108 may be an extremely low-κ dielectric, which may be a low-κ dielectric with porosity that reduces the overall dielectric constant. The metallization layers 118 include metal features 107 formed in trenches within the dielectric 108. The metal features 107 may include wires and vias. In some implementations, the metal features 107 in the metallization layers 118 and the vias 109 in the ILD layers 117 are made of a metal, such as copper or aluminum. The vias 109 electrically connect the metal features 107 across the metallization layers 118. The metallization layers 118 are commonly identified as the M1 metallization layer, the M2 metallization layer, the M3 metallization layer, and the M4 metallization layers, as shown in FIG. 1.

The access transistor 113, controlled by a word line (denoted as "WL") signal, turns on or turns off. When the access transistor 113 turns on, the RRAM device 103 becomes connected between a bit line (denoted as "BL") and a source line (denoted as "SL"). In a cell array including many RRAM cells 190 arranged in rows and columns, by selectively applying signals to word lines, bit lines, and source lines, the support circuitry (including, for example, a control logic, a word-line decoder, a bit-line decoder, a source-line decoder, a sensing circuitry, and the like) can perform the forming, set, reset, and read operations of the selected RRAM device 103. An example RRAM circuit will be described in detail below with reference to FIG. 5.

In the illustrated example, the access transistor 113 includes a source region 112 and a drain region 110 formed in the substrate 114 and a gate 111 formed over the substrate 114. It should be noted that the access transistor 113 is only one example and other types of transistors (e.g., FinFETs) are within the scope of the disclosure. Contacts 119 connect the source region 112 and drain region 110 to the lowest metallization layers (i.e., the M1 layer) 118. The contacts 119 may be made of a metal, such as copper or tungsten for example. As such, the source region 112 can be connected to the source line, whereas the drain region can be connected to the RRAM device 103. In the illustrated example, the word line is connected to the gate 111, the bit line is connected to a metal feature 107 in the M4 metallization layer 118, and the source line is connected to a metal feature 107 in the M2 metallization layer 118.

In the illustrated example, the integrated circuit device 100 has a one-transistor-one-resistor (1T1R) architecture. In some other embodiments, the access device is a diode instead of an access transistor, and the architecture is a one-diode-one-resistor (1D1R) architecture. In other embodiments, the access device is a bipolar junction transistor (BJT), and the architecture is a one-bipolar-junction-transistor-one-resistor (1BJT1R) architecture. In still other embodiments, the access device is a bipolar switch, and the architecture is a one-switch-one-resistor (1S1R) architecture.

Figure 2:
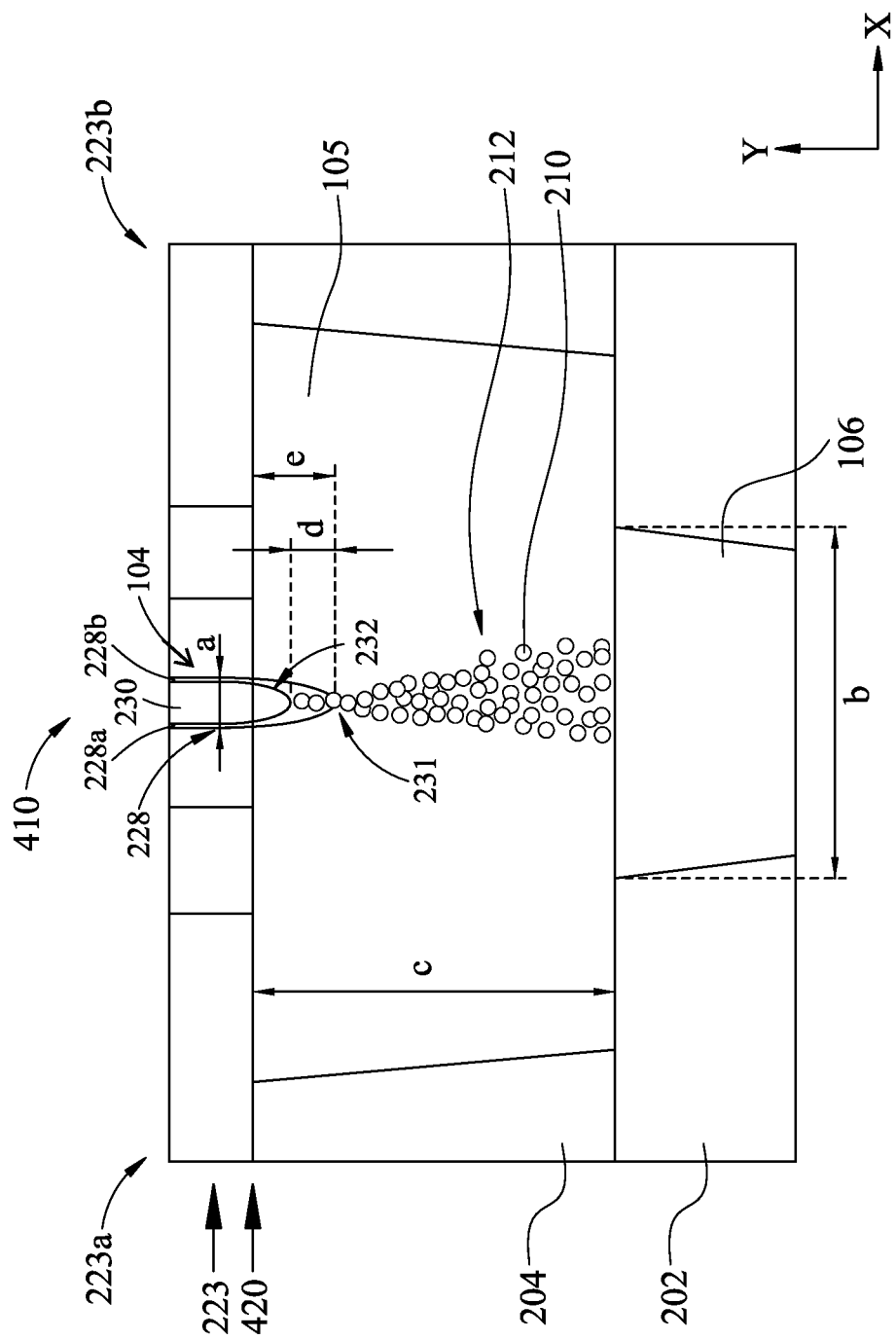
FIG. 2 is a diagram illustrating the example RRAM device shown in FIG. 1 in accordance with some embodiments.

FIG. 2 is a diagram illustrating the example RRAM device 103 shown in FIG. 1 in accordance with some embodiments. In the illustrated example, as mentioned above, the RRAM device 103 includes the bottom electrode 106, the switching layer 105, and the top electrode region 104. In the example shown in FIG. 1 and FIG. 2, the RRAM device 103 is formed between the M3 and M4 metallization layers 118. In other words, the bottom electrode 106 is connected to a metal feature in the M3 metallization layer 118, whereas the top electrode region 104 is connected to a metal feature in the M4 metallization layer 118. It should be noted that, in other examples, the RRAM device 103 may be formed between another adjacent pair of metallization layers 118, such as between the M4 and M5 metallization layers 118, or elsewhere within integrated circuit device 100.

The bottom electrode 106 is disposed in a first dielectric layer 202, whereas the switching layer 105 is disposed in a second dielectric layer 204. The top electrode region 104 is disposed in a third dielectric layer 223 and extends downwardly, in a vertical direction (i.e., the Y direction as shown in FIG. 2) into the switching layer 105. In the example shown in FIG. 2, the top electrode region 104 extends downwardly beyond the interface 420 between the third dielectric layer 223 and the switching layer 105. In other words, the top electrode region 104 has a portion above the interface 420 and another portion below the interface 420. The top electrode region 104 is situated between two dielectric regions 223a and 223b in a horizontal direction (i.e., the X direction as shown in FIG. 2). In one embodiment, the third dielectric layer 223 is made of silicon dioxide. It should be noted that the third dielectric layer 223 made of low-κ materials are within the scope of the disclosure.

In the illustrated example, the top electrode region 104 is located in a recess 410. The recess is 410 located in the third electric layer 223 and extends downwardly into the switching layer. In other words, the recess 410 has a portion above the interface 420 and another portion below the interface 420. The recess 410 has a tapered shape. In other words, the recess 410 diminishes in width in the X direction as it extends downwardly in the Z direction. In one embodiment, the recess 420 has a needle-like shape. As will be described below with reference to FIGS. 3 and 4E-4G, in one implementation, the recess 410 is formed using a combination of the dummy-spacer forming process and the over-etching process.

In the illustrated example, the top electrode region 104 includes an oxygen-rich dielectric layer 228 and a top electrode 230. The oxygen-rich dielectric layer 228 is sandwiched between the top electrode 230 and either the third dielectric layer 223 (for the portion above the interface 420) or the switching layer 105 (for the portion below the interface 420). The oxygen-rich dielectric layer 228 includes a left half 228a formed on the left sidewall of the recess 410 and a right half 228b formed on the right sidewall of the recess 410. The oxygen-rich dielectric layer 228 has a tip 231 located in the switching layer 105 and protruding downwardly. In other words, the tip 231 is pointing toward the switching layer 105.

The top electrode 230 is formed over the oxygen-rich dielectric layer 228. As a result, the top electrode 230 also has a tapered shape. In one embodiment, the top electrode 230 has a needle-like shape. The top electrode 230 has a tip 232. In one embodiment, the tip 232 is located in the switching layer. In other words, the tip 232 is below the interface 420.

Due to the tapered shape of the top electrode region 104, a point discharge occurs when the filament 212 is formed by applying a forming voltage ($V_{forming}$) to the top electrode 230. In the illustrated example shown in FIG. 2, the filament 212 corresponds to the remaining oxygen vacancies 210. Since the tip 232 has a large curvature, the electrical field around the tip 232 is larger than that of a conventional top electrode, given the same voltage. As a result, it becomes easier to break down the switching layer 105 to form the filament 212. In other words, it becomes easier to form the filament 212 between the tip 231 and the bottom electrode 106 than between a conventional electrode, which is a flat electrode, and the bottom electrode 106. Accordingly, the formation of the filament 212 is more predictable and controllable. As a result, the endurance and data retention in the RRAM device 103 is improved significantly.

On the other hand, the oxygen-rich dielectric layer 228 is a layer with a relatively high concentration of oxygen ions. In one embodiment, the oxygen-rich dielectric layer 228 has a concentration of oxygen ions higher than a threshold concentration. In one embodiment, the oxygen-rich dielectric layer 228 has a concentration of oxygen ions higher than that of the switching layer 105, if the oxygen-rich dielectric layer 228 and the switching layer 105 are made of the same material. As such, the oxygen-rich dielectric layer 228 can have enough oxygen ions to compensate for the loss of oxygen ions after frequent switching operations. The high concentration of oxygen ions makes the oxygen-rich dielectric layer 228 a good compensation source for the loss of oxygen ions after frequent switching operations. Accordingly, the endurance and the data retention of the RRAM device 103 are improved significantly.

Additionally, the distance between the tip 232 of the top electrode 230 and the bottom electrode 106 becomes smaller because the tip 232 is below the interface 420. As a result, the operation voltage to break down the switching layer 105 (i.e., to form the filament 212) becomes smaller, therefore resulting in a lower power assumption.

As shown in FIG. 2, the top surface of the bottom electrode 106 has a width b in the X direction; the top surface of the top electrode region 104 has a width a in the X direction; the switching layer 105 has a height c in the Y direction; the tip 231 of the oxygen-rich dielectric layer 228 has a depth e in the Y direction measuring from the interface 420; the distance between the tip 231 of the oxygen-rich dielectric layer 228 and the tip 232 of the top electrode 230 is d. In one embodiment, d is equal to or larger than 0.5 nanometers. In one embodiment, the relationship between d and b is $0.001b \leq d < b$. In one embodiment, the relationship between d and a is $0.001a \leq d < a$. In one embodiment, the relationship between a and b is $0.001b \leq a < b$. In another embodiment, the relationship between a and b is $0.001b \leq a < 0.2b$. In one embodiment, the relationship between c and a is $c \geq 0.001a$. In one embodiment, the relationship between c and b is $c \geq 0.001b$. In one embodiment, the relationship between c and e is $e \geq 0.01c$.

Figure 3:
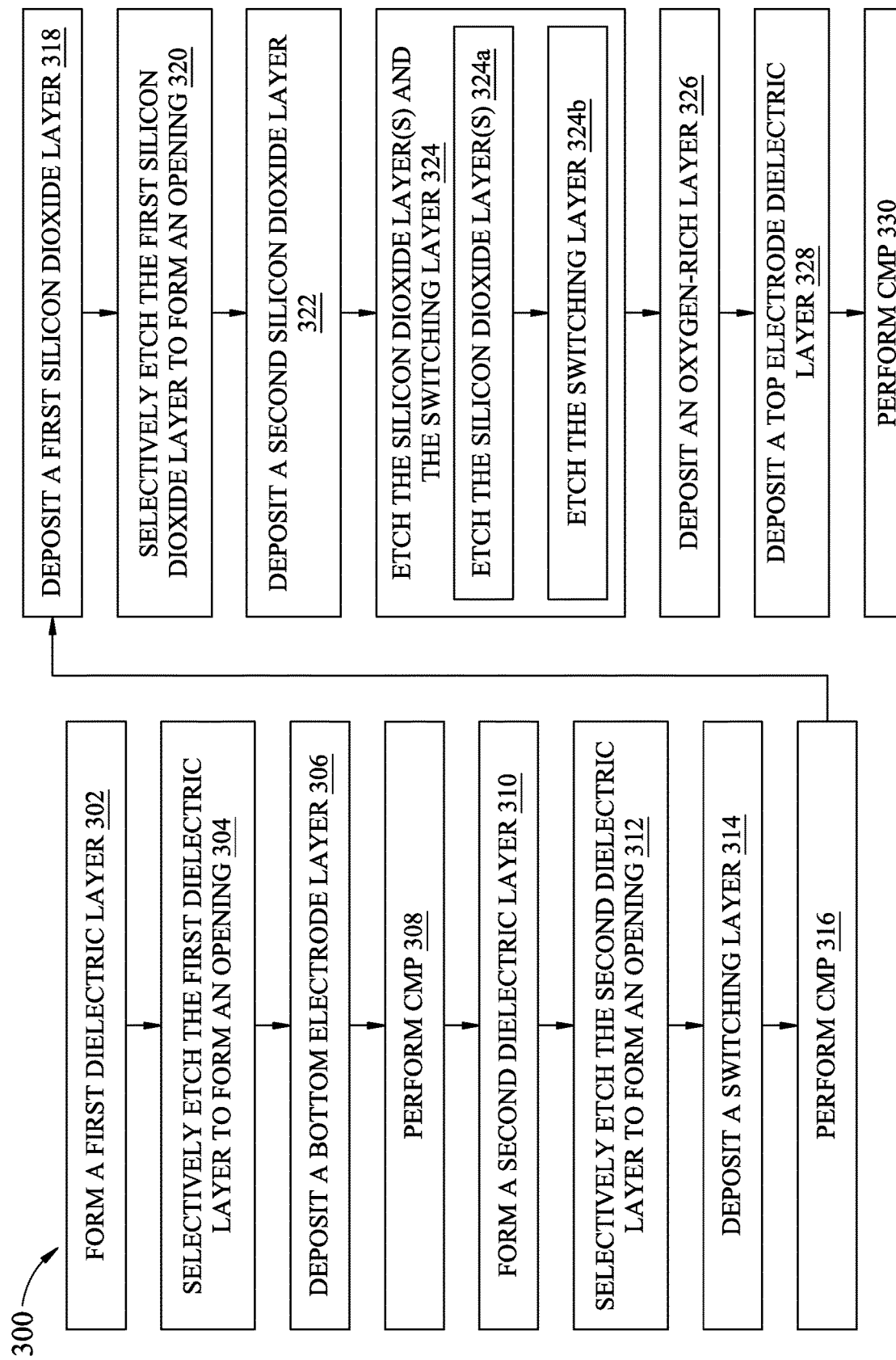
FIG. 3 is a diagram illustrating an example method of fabricating an RRAM device in accordance with some embodiments.

FIG. 3 is a diagram illustrating an example method 300 of fabricating an RRAM device in accordance with some embodiments. FIGS. 4A-4L are diagrams illustrating cross-sectional views of an RRAM device 400 at various fabrication stages in accordance with some embodiments. In some embodiments, the RRAM device 400 may be included in a microprocessor, memory cell, and/or other integrated circuits. Also, FIGS. 4A-4L are simplified for a better understanding of the concepts of the present disclosure. For example, although FIGS. 4A-4L illustrate the RRAM device 400, it is understood the integrated circuit, in which the RRAM device 400 is formed, may include a number of other devices including resistors, capacitors, inductors, fuses, and the like, which are not shown in FIGS. 4A-4L, for purposes of clarity of illustration.

The method 300 starts at operation 302. At operation 302, a first dielectric layer is formed. In one embodiment, a first dielectric layer is formed over a substrate. In another embodiment, a first dielectric layer is formed over a metallization layer. In the example shown in FIG. 4A, a first dielectric layer 202 is formed over a metallization layer 118

(e.g., a M3 metallization layer 118). The metallization layer 118 has a metal feature 107. The metal feature 107 is made of metal such as copper or aluminum. In some embodiments, the first dielectric layer 202 comprises silicon nitride (SiN), silicon carbide (SiC), or a similar composite dielectric film. In some embodiments, the first dielectric layer 202 may be formed by a deposition technique (e.g., physical vapor deposition (PVD), chemical vapor deposition (CVD), plasma-enhanced CVD (PECVD), atomic layer deposition (ALD), sputtering, etc.) to a predetermined thickness range.

The method 300 then proceeds to operation 304. At operation 304, the first dielectric layer is selectively etched to form an opening. In the example shown in FIG. 4A, an opening 402 is formed in the first dielectric layer 202, and the opening 402 is above the metal feature 107. As a result, a portion of the metal feature 107 is exposed. In one implementation, the opening 402 is formed by etching areas of the first dielectric layer 202 that are left exposed by a photoresist mask. In other implementations, the opening is formed by etching areas of the first dielectric layer 202 that are left exposed by a hard mask such as a nitride hard mask. In some implementations, the first dielectric layer 202 is selectively etched by wet etching. In other implementations, the first dielectric layer 202 is selectively etched by dry etching. In yet other implementations, the first dielectric layer 202 is selectively etched by plasma etching.

The method 300 then proceeds to operation 306. At operation 306, a bottom electrode layer is deposited. In one implementation, the bottom electrode layer is deposited using PVD. In one embodiment, the bottom electrode layer is made of a metal such as titanium (Ti), tantalum (Ta), aluminum (Al), copper (Cu), and tungsten (W). In another embodiment, the bottom electrode layer is made of a metal alloy such as an aluminum-copper (AlCu) alloy.

The method 300 then proceeds to operation 308. At operation 308, a chemical-mechanical planarization (CMP) process is performed. The CMP process is performed on the bottom electrode layer until the first dielectric layer is also polished out (i.e., exposed). In the example shown in FIG. 4B, the CMP process removes the portion of the bottom electrode layer that is outside the opening 402. Since the first dielectric layer 202 is polished out, the bottom electrode 106 is formed in the opening 402.

The method then proceeds to operation 310. At operation 310, a second electric layer is formed over the first dielectric layer. In some embodiments, the second electric layer and the first electric layer are made of the same material. In other embodiments, the second electric layer and the first electric layer are made of different materials. In some embodiments, the second dielectric layer comprises silicon nitride (SiN), silicon carbide (SiC), or a similar composite dielectric film. In some embodiments, the second dielectric layer may be formed by a deposition technique (e.g., PVD, CVD, PECVD, ALD, sputtering, etc.) to a predetermined thickness range.

The method 300 then proceeds to operation 312. At operation 312, the second dielectric layer is selectively etched to form an opening. In the example shown in FIG. 4C, an opening 404 is formed in the second dielectric layer 204, and the opening 404 is above the bottom electrode 106. As a result, the entire bottom electrode 106 is exposed. In one implementation, the opening 404 is formed by etching areas of the second dielectric layer 204 that are left exposed by a photoresist mask. In other implementations, the opening is formed by etching areas of the second dielectric layer 204 that are left exposed by a hard mask such as a nitride hard mask. In some implementations, the second dielectric layer 204 is selectively etched by wet etching. In other implementations, the second dielectric layer 204 is selectively etched by dry etching. In yet other implementations, the second dielectric layer 204 is selectively etched by plasma etching.

The method 300 then proceeds to operation 314. At operation 314, a switching layer is deposited. The switching layer is deposited using suitable techniques such as ALD and PVD. The switching layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like.

The method 300 then proceeds to operation 316. At operation 316, a CMP process is performed. The CMP process is performed on the switching layer until the second dielectric layer is also polished out (i.e., exposed). In the example shown in FIG. 4D, the CMP process removes the portion of the switching layer that is outside the opening 404. Since the second dielectric layer 204 is polished out, the switching layer 105 is formed in the opening 404.

The method 300 then proceeds to operation 318. At operation 318, a first silicon dioxide layer is deposited. In one embodiment, the first silicon dioxide layer is deposited using PECVD. In another embodiment, the first silicon dioxide layer is deposited using thermal CVD. In yet another embodiment, the first silicon dioxide layer is deposited using ALD.

The method 300 then proceeds to operation 320. At operation 320, the first silicon dioxide layer is selectively etched to form an opening. In the example shown in FIG. 4E, an opening 406 is formed in the first silicon dioxide layer, and the opening 406 is above the switching layer 105. As a result, a portion of the switching layer 105 is exposed. After the opening 406 is formed, the remaining first silicon dioxide layer has two first silicon dioxide regions 224a and 224b on both sides of the opening 406. In one implementation, the opening 406 is formed by etching areas of the first silicon dioxide layer that are left exposed by a photoresist mask. In other implementations, the opening is formed by etching areas of the first silicon dioxide layer that are left exposed by a hard mask such as a nitride hard mask. In some implementations, the first dielectric layer 202 is selectively etched by wet etching. In other implementations, the first dielectric layer 202 is selectively etched by dry etching. In yet another implementation, the first dielectric layer 202 is selectively etched by plasma etching.

The method 300 then proceeds to operation 322. At operation 322, a second silicon dioxide layer is deposited. In one embodiment, the first silicon dioxide layer is deposited using PECVD. In another embodiment, the first silicon dioxide layer is deposited using thermal CVD. In yet another embodiment, the first silicon dioxide layer is deposited using ALD. In the example shown in FIG. 4F, because of the opening 406, the second silicon dioxide layer can have two spacer-like structures (may also be referred to as "dummy spacers") 408a and 408b formed in the opening 406. Each of the spacer-like structures 408a and 408b has a round corner, and the two round corners are facing toward each other.

In one embodiment, the width g of the opening 406 in the X direction and the height h of the second silicon dioxide layer in the Y direction are chosen such that the spacer-like structures 408a and 408b are in contact with each other. In other words, there is no gap in the X direction between the spacer-like structures 408a and 408b. In the example shown in FIG. 4F, the second silicon dioxide layer can be regarded as two regions 222a and 222b.

The method 300 then proceeds to operation 324. At operation 324, the silicon dioxide layer(s) and the switching layer are etched. In one embodiment, the silicon dioxide layer(s) first, followed by etching the switching layer (referred to as an "over-etching" process). In one embodiment, a tapered recess is formed, and the tapered recess extends through the silicon dioxide layer(s) and into the switching layer. In the illustrated example shown in FIG. 4G, the tapered recess 410 is formed. The tapered recess 410 is located in the third dielectric layer 223 and extends downwardly into the switching layer 105. In other words, the tapered recess 410 has a portion above the interface 420 and another portion below the interface 420.

Figure 4B:
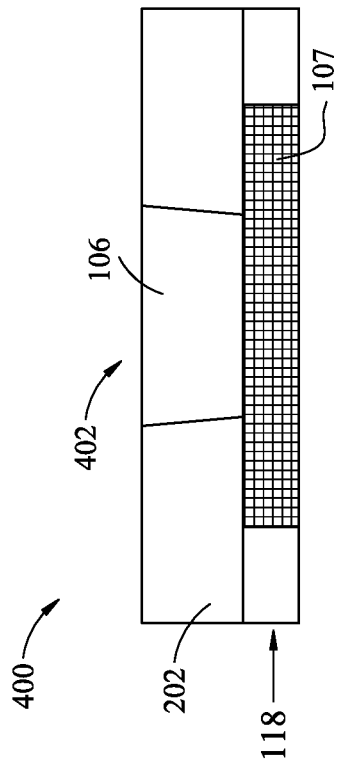
Figure 4A:
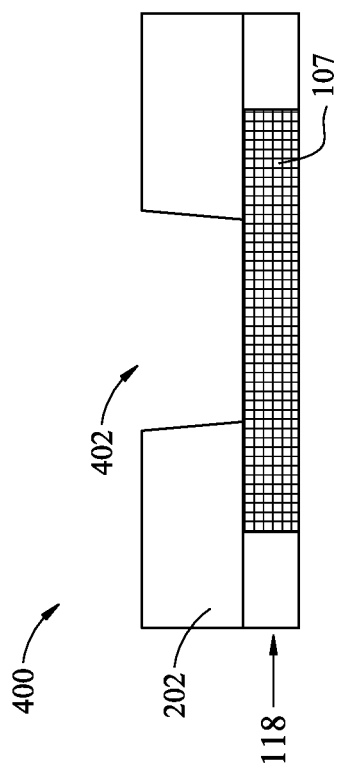
Figure 4L:
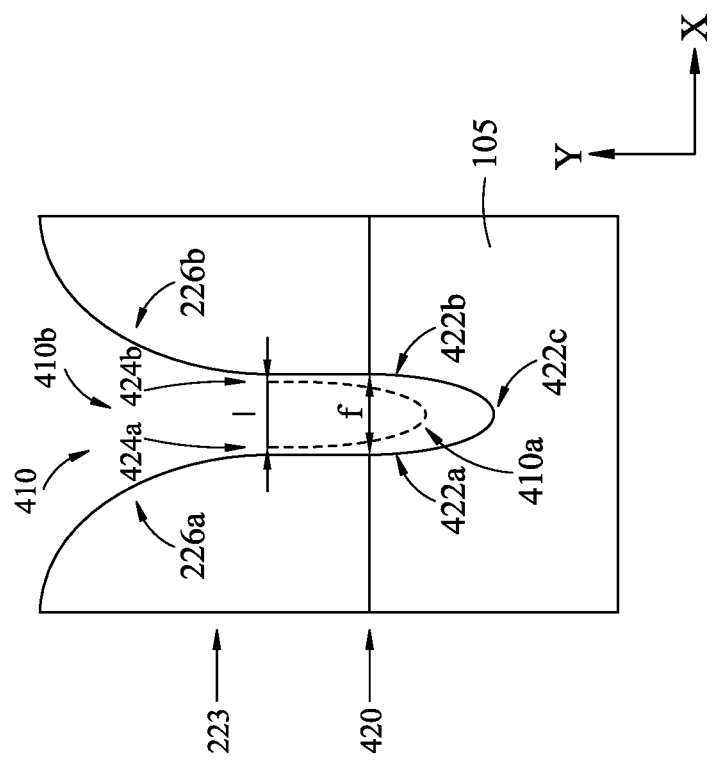
FIG. 4L is a diagram illustrating the tapered recess shown in FIG. 4G in accordance with some embodiments.

FIG. 4L is a diagram illustrating the tapered recess 410 shown in FIG. 4G in accordance with some embodiments. As shown in FIG. 4L, the tapered recess 410 has a lower portion 410a below the interface 420 and an upper portion 410b above the interface 420. The lower portion 410a includes two sidewalls 422a and 422b and a bottom 422c. The upper portion 410b includes two sidewalls 424a and 424b. The sidewalls 424a and 424b include the round corners 226a and 226b of the third dielectric layer 223, respectively. The round corners 226a and 226b are formed after the spacer-like structures 408a and 408b shown in FIG. 4G are etched.

In one embodiment, operation 324 includes operation 324a and 324b. At operation 324a, the second silicon dioxide layer is etched, and the first silicon dioxide layer below the second silicon dioxide layer may also be etched. In the illustrated example shown in FIG. 4G, the third dielectric layer 223 is etched such that the top surface of the switching layer 105 is exposed in the opening 406 shown in FIG. 4E. In one implementation, the etch system is set in a detection mode and the etching process at operation 324a stops when the switching layer 105 is detected.

At operation 324b, the switching layer is etched. In the illustrated example shown in FIG. 4G, the switching layer 105 is etched, and the lower portion 410a is formed. In the meantime, the upper portion 410b is formed as well. In one implementation, the etch system is set in a time mode and the etching process at operation 324b stops after a predetermined time period.

After operations 324a and 324b, the tapered recess 410 diminishes in width in width in the X direction as it extends downwardly in the Z direction. In one embodiment, the tapered recess has a needle-like shape. In one embodiment, the tapered recess is created in the middle of the opening 406 shown in FIG. 4E.

It should be noted that operations 324a and 324b is one example implementation of operation 324. Other implementations of operation 324 to form a tapered recess like the one shown in FIG. 4G are within the scope of the disclosure. In some implementations, the etching process employed at operation 324 is dry etching. In some implementations, the etching process employed at operation 324 is wet etching. In some implementations, the etching process employed at operation 324 is a combination of dry etching and wet etching.

The method 300 then proceeds to operation 326. At operation 326, an oxygen-rich dielectric layer is deposited. In some implementations, the oxygen-rich dielectric layer is deposited using CVD. In other implementations, the oxygen-rich dielectric layer is deposited using ALD. The oxygen-rich dielectric layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like. In the example shown in FIG. 4H, the oxygen-rich dielectric layer 228 is deposited over the tapered recess 410 shown in FIG. 4G. The oxygen-rich dielectric layer 228 fills the bottom 422c of the lower portion 410a of the tapered recess 410 shown in FIG. 4L. As such, the tip 231 of the oxygen-rich dielectric layer 228 is formed. The tip 231 has a tapered shape. In the illustrated example shown in FIG. 4H, the oxygen-rich dielectric layer 228 also covers the sidewalls 424a and 424b of the upper portion 410b of the tapered recess 410 shown in FIG. 4L. A tapered recess 412 is formed after operation 326, and the tapered recess 412 has a tip as well.

In some implementations, at operation 326, the thickness of the oxygen-rich dielectric layer 228 can be chosen based on the geometries of the tapered recess 410 shown in FIG. 4G, such that a critical dimension of the top electrode is close to a target critical dimension. This approach can increase the uniformity of the critical dimension of the top electrode. Details of this embodiment will be described below with reference to FIG. 6.

The method 300 then proceeds to operation 328. At operation 328, a top electrode layer is deposited. In one implementation, the top electrode layer is deposited using PVD. In one embodiment, the top electrode layer is made of a metal such as titanium (Ti), tantalum (Ta), aluminum (Al), copper (Cu), and tungsten (W). In another embodiment, the top electrode layer is made of a metal alloy such as an aluminum-copper (AlCu) alloy. In the example shown in FIG. 4I, the top electrode layer 230 fills the tapered recess 412.

The method 300 then proceeds to operation 330. At operation 330, a CMP process is performed. The CMP process is performed on the top electrode layer. In some embodiments, the CMP process is performed on the top electrode layer until the top surface of the third dielectric layer, which includes the first silicon dioxide layer and the second silicon dioxide layer on top of the first silicon dioxide layer, is polished out (i.e., exposed). In some embodiments, the CMP process is performed on the top electrode layer until the top surface of the top electrode region has a width a in the X direction smaller than a threshold width. In some embodiments, the CMP process is performed on the top electrode layer until the top surface of the top electrode region has a width a in the X direction as desired. In the example shown in FIG. 4J, the CMP process removes the portion of the top electrode layer that is outside the tapered recess 412. The width a (shown in FIG. 2) in the X direction of the top surface of the top electrode region can be controlled by adjusting the CMP depth in the Y direction. In the example shown in FIG. 4J, the tip 231 of the oxygen-rich dielectric layer 228 and the tip 232 of the top electrode are both below the interface 420, and the top electrode region 104 has a tapered shape.

Figure 4K:
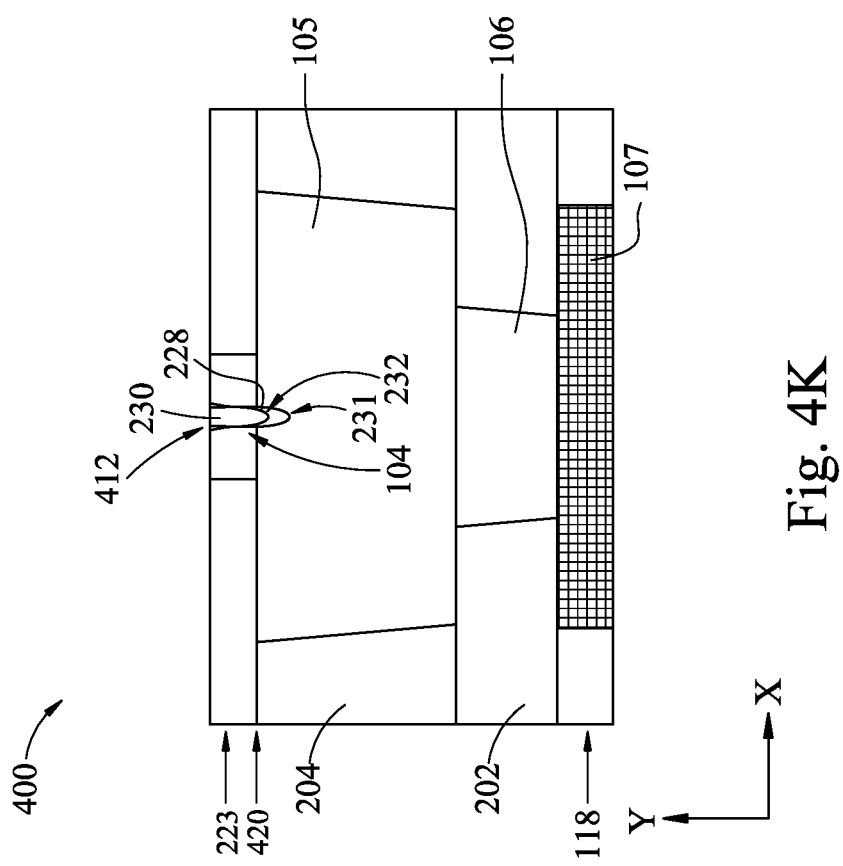

Another embodiment is illustrated in FIG. 4K. In the illustrated embodiment shown in FIG. 4K, the CMP depth in the Y direction is larger than in the illustrated embodiment shown in FIG. 4J. As a result, the third dielectric layer 223 becomes thinner, and the top electrode region 104 becomes shorter in the Y direction. The top electrode region 104 has a needle-like shape.

Figure 6:
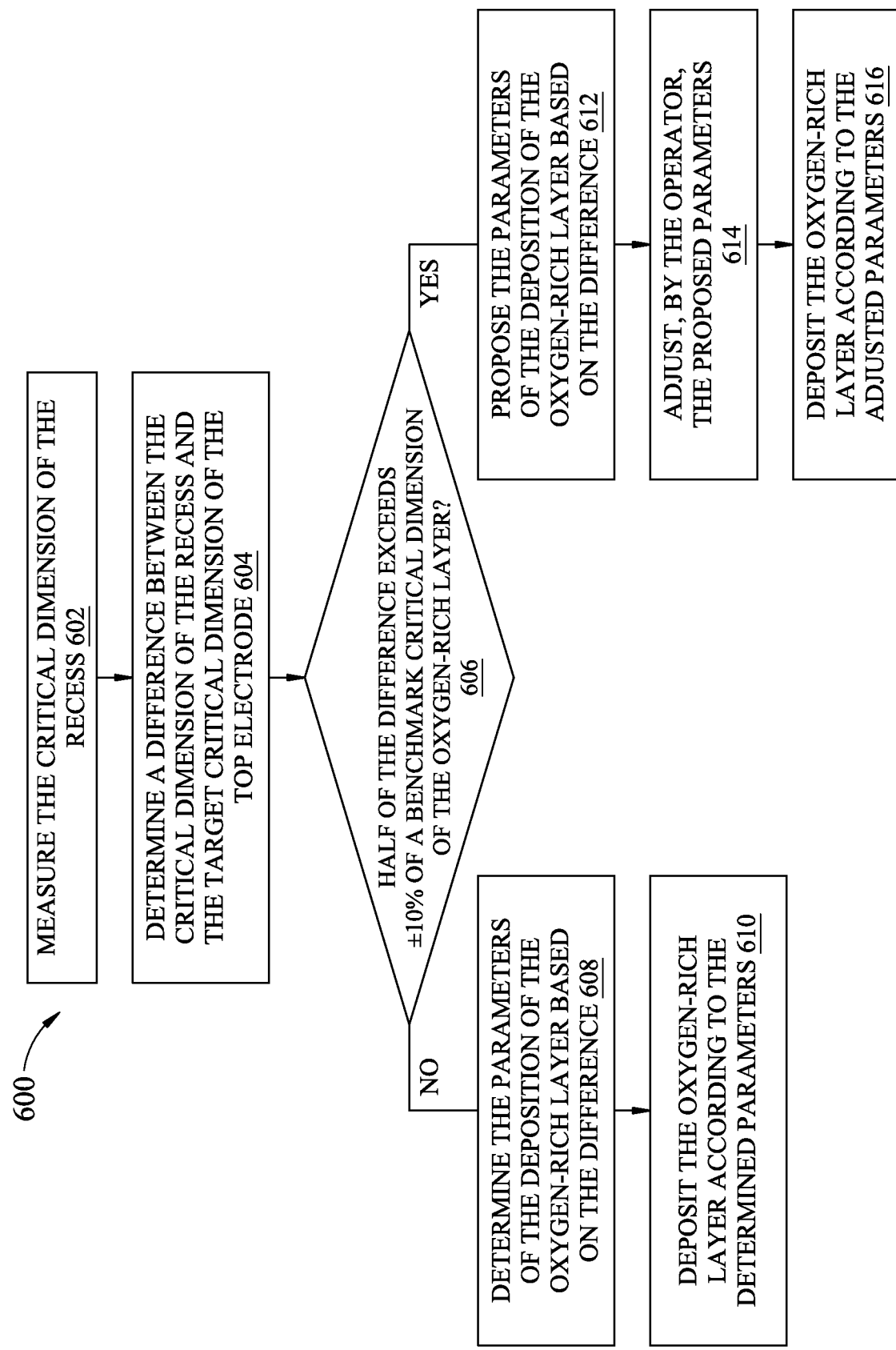
FIG. 6 is a diagram illustrating an example method of depositing an oxygen-rich dielectric layer in accordance with some embodiments.

FIG. 6 is a diagram illustrating an example method 600 of depositing an oxygen-rich dielectric layer in accordance with some embodiments. As mentioned above, the method 600 is an example implementation of operation 326 shown in FIG. 3. At operation 602, the critical dimension of the tapered recess 410 shown in FIG. 4L is measured. In the illustrated example shown in FIG. 4L, the critical dimension of the tapered recess 410 is the width f in the X direction at the interface 420. The width f is a characterization of how wide the tapered recess 410 is. It should be that other critical dimensions can be measured in other embodiments.

At operation 604, a difference between the critical dimension of the tapered recess and a target critical dimension of the top electrode is determined. In one implementation, the target critical dimension of the top electrode could be a target width l of the top electrode (denoted in dashed in FIG. 4L) in the X direction at the interface 420. It should be noted that other target critical dimensions of the top electrode can be employed in other implementations. In the example illustrated in FIG. 4L, the difference between f and l is determined. If (f–l) is large, more oxygen-rich dielectric layer 228 can be deposited; if (f–l) is small, less oxygen-rich dielectric layer 228 can be deposited. As such, the uniformity of the critical dimension of the top electrode 230 can be increased.

At operation 606, it is determined whether half of the difference exceeds a predetermined percentage of a benchmark critical dimension of the oxygen-rich dielectric layer. Half of the difference (f–l)/2 is a characterization of the gap between the tapered recess 410 and the top electrode 230. The predetermined percentage is a characterization of the capacity of adjusting the thickness of the oxygen-rich dielectric layer 228 at operation 326 shown in FIG. 3, which is limited by the fabrication system and equipment. In some examples, the predetermined percentage is 10%. In other examples, the predetermined percentage is 20%. In other examples, the predetermined percentage is 5%.

If half of the difference (f–l)/2 does not exceed the predetermined percentage of the benchmark critical dimension of the oxygen-rich dielectric layer 228, the method 600 proceeds to operation 608. At operation 608, the parameters of the deposition of the oxygen-rich dielectric layer are determined based on the difference since the adjustment is within the adjusting capacity of the deposition process. As such, if the difference (f–l) is large, parameters are chosen to deposit a thicker oxygen-rich dielectric layer 228; if the difference (f–l) is small, parameters are chosen to deposit a thinner oxygen-rich dielectric layer 228. At operation 610, the oxygen-rich dielectric layer 228 is deposited according to the determined parameters. In one embodiment, the operations 602, 604, 606, 608, and 610 are automatic.

If, on the other hand, half of the difference (f–l)/2 exceeds the predetermined percentage of the benchmark critical dimension of the oxygen-rich dielectric layer 228, the method 600 proceeds to operation 612. At operation 612, the parameters of the deposition of the oxygen-rich dielectric layer are proposed based on the difference, although the adjustment is outside the adjusting capacity of the deposition process.

The method 600 then proceeds to operation 614. At operation 614, the proposed parameters are reviewed by an operator or a technician. In one embodiment, the operator or technician adjusts the proposed parameters after reviewing the whole process corresponding to method 300 shown in FIG. 3. In some examples, the operator or technician can approve the proposed parameters without changes after reviewing the whole process corresponding to method 300 shown in FIG. 3, in which case the proposed parameters are the same as the adjusted parameters.

The method 600 then proceeds to operation 616. At operation 616, the oxygen-rich dielectric layer 228 is deposited according to the adjusted parameters. In one embodiment, the operations 602, 604, 606, and 612 are automatic.

In this manner, the method 600 shown in FIG. 6 can increase the uniformity of the top electrode. The critical dimensions of the top electrode affect the "set" behavior of the RRAM device 103. Improved uniformity of the top electrode among different cells in a memory cell array or among chips in different batches can improve endurance of the RRAM devices because situations such as over-writing, too-strong filaments can be avoided.

Figure 5:
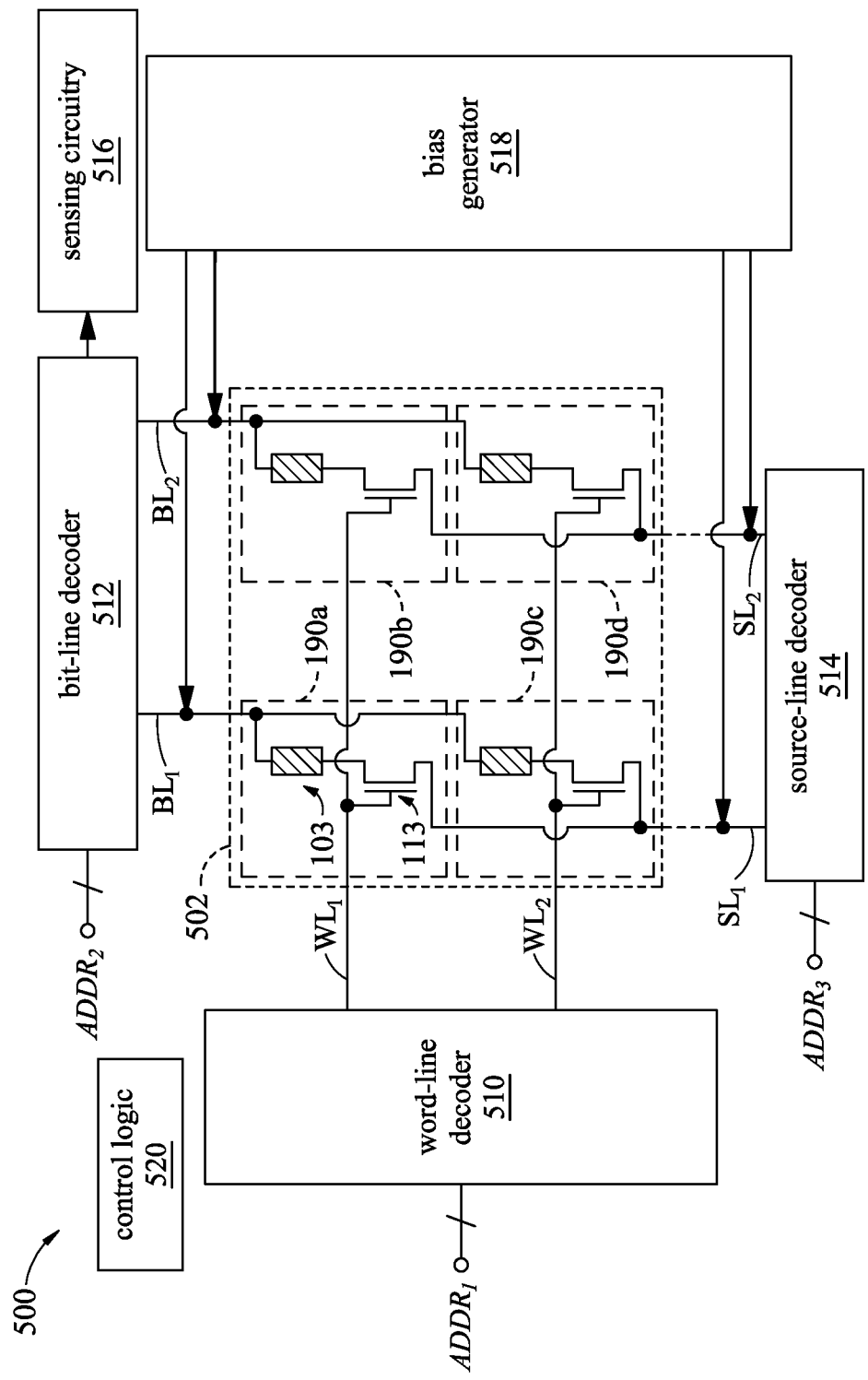
FIG. 5 is a diagram illustrating an example RRAM circuit having the RRAM cell shown in FIG. 1 in accordance with some embodiments.

FIG. 5 is a diagram illustrating an example RRAM circuit 500 having the RRAM cell 190 shown in FIG. 1 in accordance with some embodiments. It should be noted that RRAM device 103 shown in FIG. 2 can also be used in various applications such as logic circuits, light-emitting diode (LED) circuits, liquid crystal display (LCD) circuits, CMOS image sensor (CIS) circuits, and the like.

In the illustrated example, the RRAM circuit 500 includes, among other things, an RRAM cell array 502, a word-line decoder 510, a bit-line decoder 512, a source-line decoder 514, a sensing circuitry 516, a bias generator 518, and a control logic 520. The RRAM cell array 502 includes multiple RRAM cells 190 like the one shown in FIG. 1, and the multiple RRAM cells 190 are arranged in multiple rows and multiple columns.

In the example shown in FIG. 5, four RRAM cells 190 are arranged in two rows and two columns. The RRAM cells 190a and 190b in the first row are operably coupled to the word line WL1. The RRAM cells 190c and 190d in the second row are operably coupled to the word line WL2. The RRAM cells 190a and 190c in the first column are operably coupled to the bit line BL1 and the source line SL1. The RRAM cells 190b and 190d in the second column are operably coupled to the bit line BL2 and the source line SL2. The RRAM cells 190a, 190b, 190c, and 190d are respectively associated with an address defined by an intersection of a word line WL1 or WL2 and a bit line BL1 or BL2 and/or a source line SL1 or SL2.

Each of the RRAM cells 190a, 190b, 190c, and 190d includes the RRAM device 103 as shown in FIG. 1 and FIG. 2 and an access transistor 113 as shown in FIG. 1. The RRAM device 113 has a resistance state that is switchable between a low resistance state (LRS) and a high resistance state (HRS). The resistance states are indicative of a data value (e.g., a "1" or "0") stored within the RRAM device 103. The RRAM device 103 has a first terminal coupled to a bit line BL1 or BL2 and a second terminal coupled to its corresponding access transistor 113. The access transistor 113 has a gate coupled to a word line WL1 or WL2, a source coupled to a source line SL1 or SL2, and a drain coupled to the second terminal of the RRAM device 103. By activating the word line WL1 or WL2, the access transistor 113 is turned on, allowing for a source line SL1 or SL2 to be coupled to the second terminal of the RRAM device 103.

The RRAM cell array 502 is coupled to support circuitry that is configured to read data from and/or write data to the plurality of RRAM cells 190a, 190b, 190c, and 190d. In some embodiments, the support circuitry comprises the word-line decoder 510, the bit-line decoder 512, the source-line decoder 514, and the sensing circuitry 516. The word-line decoder 510 is configured to selectively apply a signal (e.g., a current and/or voltage) to one of the word lines WL1 and WL2 based upon a first address ADDR1; the bit-line decoder 512 is configured to selectively apply a signal to one of the plurality of bit lines BL1 and BL2 based upon a second address ADDR2; the source-line decoder 514 is configured to selectively apply a signal to one of the plurality of source lines SL1 and SL2 based upon a third address ADDR3. In some embodiments, the second address ADDR2 and the third address ADDR3 may be a same address.

By selectively applying signals to the word lines WL1 and WL2, the bit lines BL1 and BL2, and the source lines SL1 and SL2, the support circuitry is able to perform forming, set, reset, and read operations on selected ones of the plurality of RRAM cells 190a, 190b, 190c, and 190d. For example, to read data from the RRAM cell 190a, the word-line decoder 510 applies a signal (e.g., voltage) to the word line WL1, the bit-line decoder 512 applies a signal (e.g., voltage) to the bit line BL1, and the source-line decoder 514 applies a signal (e.g., voltage) to the source line SL1. The applied signals cause the sensing circuitry 516 to receive a signal (e.g., voltage) having a value that is dependent upon a data state of the RRAM cell 190a. The sensing circuitry 516 is configured to sense this signal and to determine the data state of the selected RRAM cell 190a based on the signal (e.g., by comparing a received voltage to a reference voltage).

The bias generator 518 is configured to provide various bias voltages for different components of the RRAM circuit 500. In the illustrated example, the bias generator 518 generates bias voltages for the bit lines BL1 and BL2 and the source lines SL1 and SL2. The control logic 520 is configured to control the functioning of the RRAM circuit 500.

Figure 7:
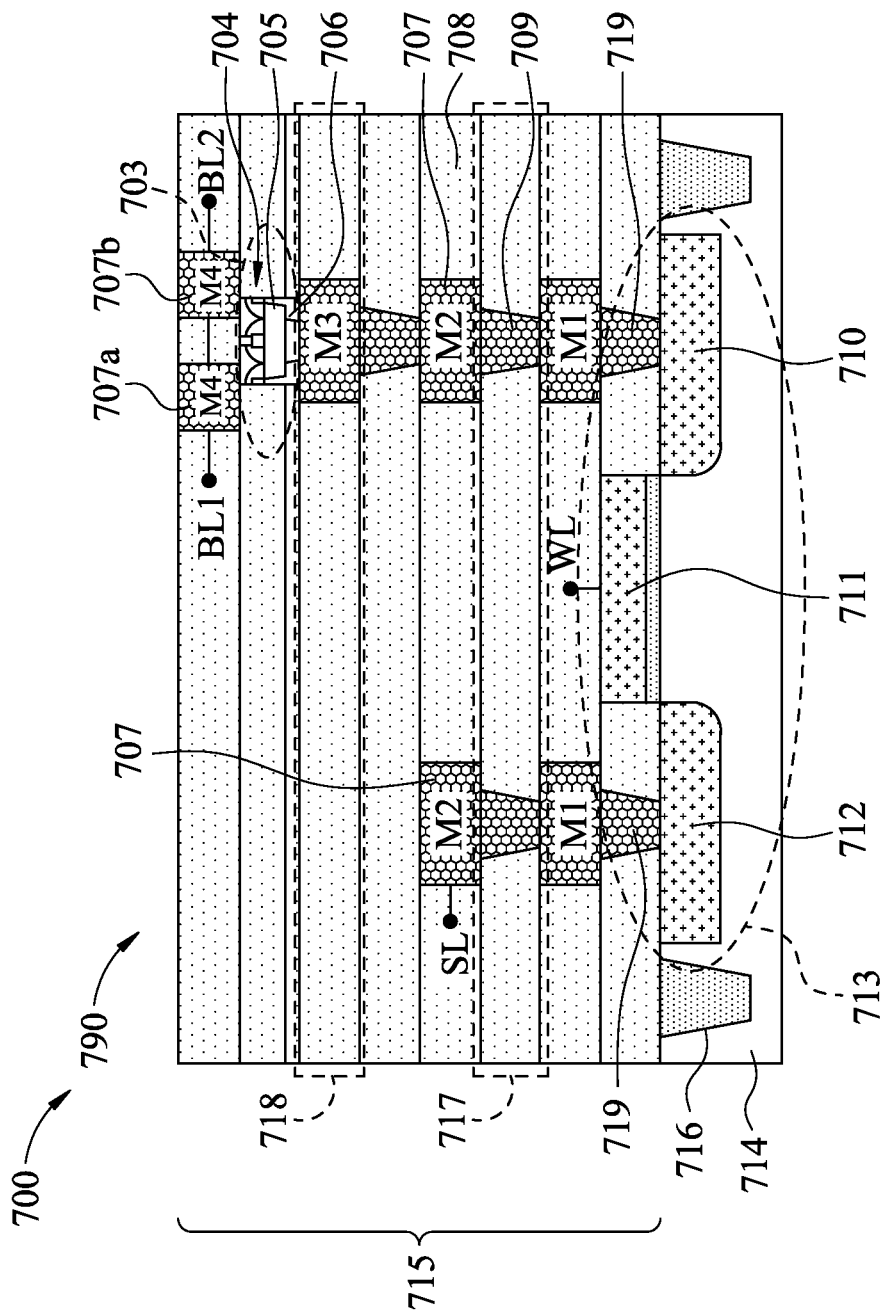
FIG. 7 is a diagram illustrating an example integrated circuit device including an RRAM device in accordance with some embodiments.

FIG. 7 is a diagram illustrating an example integrated circuit device 700 including an RRAM device 703 in accordance with some embodiments. In the illustrated example, the integrated circuit device 700 includes an RRAM cell 790, which includes the RRAM device 703 and an access transistor 713. In other embodiments, an integrated circuit device includes multiple RRAM cells arranged in rows and columns. In the illustrated example shown in FIG. 7, the RRAM device 703 includes two isolated top electrodes instead of a conventional top electrode to address the aforementioned challenges resulted from the filament variations and the loss of oxygen ions. Additionally, the two isolated top electrodes increase areal density, which is a measure of the quantity of information bits that can be stored in a given area. It should be noted that multiple (e.g., three, four, etc.) isolated top electrodes are within the scope of the disclosure. The RRAM device 703 also includes a bottom electrode 706 and a switching layer 705 between the bottom electrode 706 and the two isolated top electrodes. The RRAM device 703 can be considered as two separate RRAM devices that share the bottom electrode 706. As explained above, the electrical resistance of the switching layer 705 can be changed between a high resistance state (HRS) and a low resistance state (LRS) if one filament occurs. Therefore, each of the two separate RRAM devices that share the bottom electrode 706 can have a filament formed in the switching layer 705, therefore, storing two bits instead of one bit. Details of the structure of the RRAM device 703 will be described below with reference to FIG. 8, whereas details of the fabrication of the RRAM device 703 will be described below with reference to FIGS. 10A-10I.

In the illustrated example, the integrated circuit device 700 includes an interconnect structure 715 formed over a substrate 714. The substrate 714 may be, for example, a bulk substrate (e.g., a bulk silicon substrate) or a silicon-on-insulator (SOI) substrate. In some examples, the substrate 114 may also be a binary semiconductor substrate (e.g., GaAs), a ternary semiconductor substrate (e.g., AlGaAs), or a higher order semiconductor substrate. In the illustrated example, the substrate 714 includes shallow trench isolation (STI) regions 716 formed by filling trenches in the substrate 714 with dielectric. The interconnect structure 715 includes a plurality of inter-level dielectric (ILD) layers 717 interleaved with metallization layers 718. In the illustrated example, the ILD layers 717 include vias 709. In some implementations, dielectric 708 is, for example, low-κ dielectric, such as undoped silicate glass or an oxide, such as silicon dioxide or silicon carbide. The dielectric 708 may be an extremely low-κ dielectric, which may be a low-κ dielectric with porosity that reduces the overall dielectric constant. The metallization layers 118 include metal features 707 formed in trenches within the dielectric 708. The metal features 707 may include wires and vias. In some implementations, the metal features 707 in the metallization layers 718 and the vias 709 in the ILD layers 717 are made of a metal, such as copper or aluminum. The vias 709 electrically connect the metal features 707 across the metallization layers 718. The metallization layers 718 are commonly identified as the M1 metallization layer, the M2 metallization layer, the M3 metallization layer, and the M4 metallization layers, as shown in FIG. 7.

The access transistor 713, controlled by a word line (denoted as "WL") signal, turns on or turns off. When the access transistor 713 turns on, the RRAM device 703 becomes connected between two bit lines (denoted as "BL1" and "BL2") and a source line (denoted as "SL"). In a cell array including multiple RRAM cells 790 arranged in rows and columns, by selectively applying signals to word lines, bit lines, and source lines, the support circuitry (including, for example, a control logic, a word-line decoder, a bit-line decoder, a source-line decoder, a sensing circuitry, and the like) can perform the forming, set, reset, and read operations of the selected RRAM device 703. An example RRAM circuit will be described in detail below with reference to FIG. 11.

In the illustrated example, the access transistor 713 includes a source region 712 and a drain region 710 formed in the substrate 714 and a gate 711 formed over the substrate 714. It should be noted that the access transistor 713 is only one example and other types of transistors (e.g., FinFETs) are within the scope of the disclosure. Contacts 719 connect the source region 712 and drain region 710 to the lowest metallization layers (i.e., the M1 layer) 718. The contacts 719 may be made of a metal, such as copper or tungsten for example. As such, the source region 712 can be connected to the source line, whereas the drain region can be connected to the RRAM device 703. In the illustrated example, the word line is connected to the gate 711; the first bit line (denoted as "BL1") is connected to a metal feature 707a in the M4 metallization layer 718; the second bit line (denoted as "BL2") is connected to a metal feature 707b in the M4 metallization layer 718; the source line is connected to a metal feature 707 in the M2 metallization layer 718. As mentioned above, multiple (e.g., three, four, etc.) isolated top electrodes are within the scope of the disclosure. Therefore, multiple bit lines can be used (e.g., each of the multiple isolated top electrodes has its corresponding bit lines) accordingly. In such a case, metal features and vias in higher metallization layers 718 (e.g., the M5 metallization layer, the M6 metallization layer, etc.) can be employed.

In the illustrated example, the integrated circuit device 700 has a one-transistor-one-resistor (1T1R) architecture. In some other embodiments, the access device is a diode instead of an access transistor, and the architecture is a one-diode-one-resistor (1D1R) architecture. In other embodiments, the access device is a bipolar junction transistor (BJT), and the architecture is a one-bipolar-junction-transistor-one-resistor (1BJT1R) architecture. In still other embodiments, the access device is a bipolar switch, and the architecture is a one-switch-one-resistor (1S1R) architecture.

Figure 8:
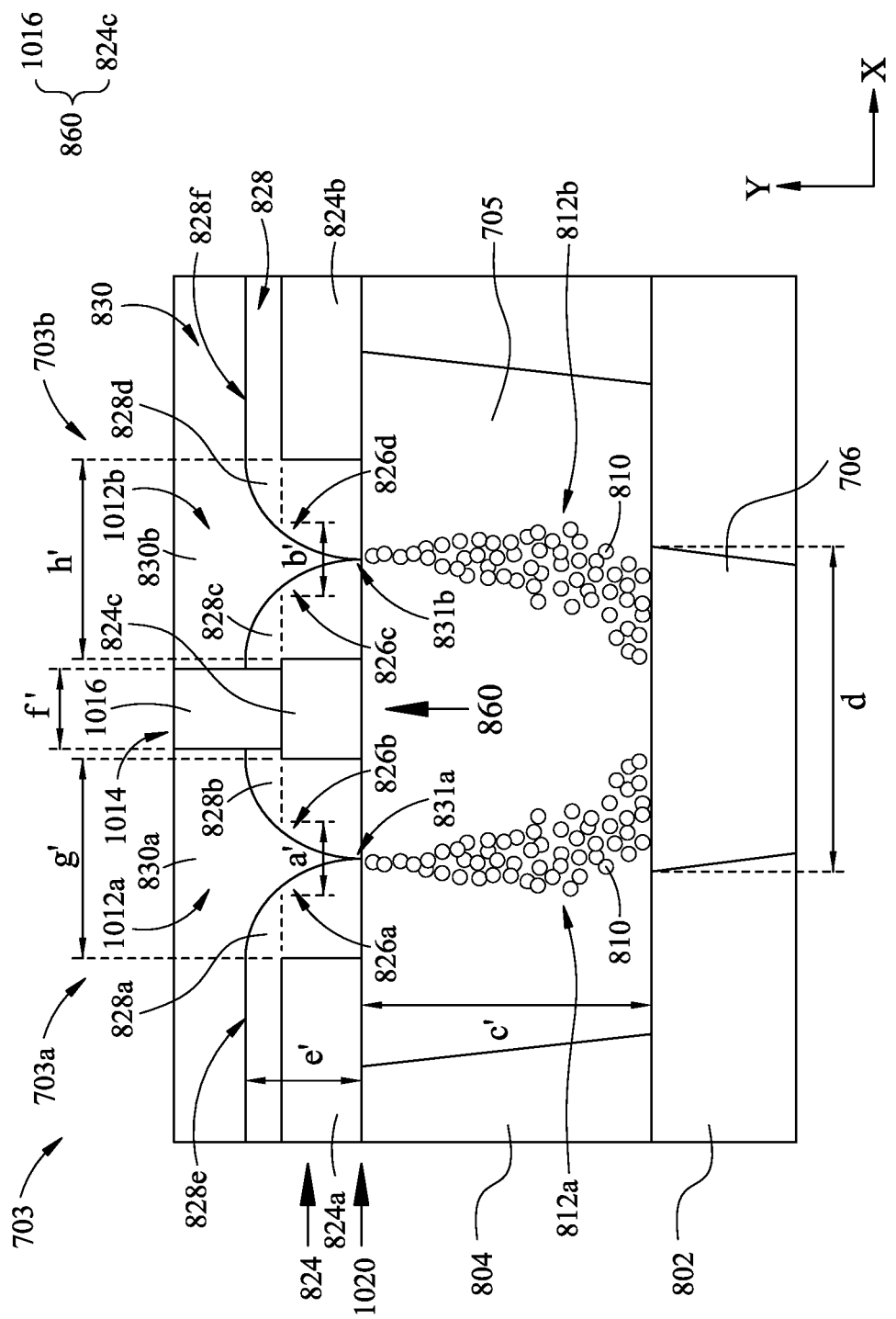
FIG. 8 is a diagram illustrating the example RRAM device shown in FIG. 1 in accordance with some embodiments.

FIG. 8 is a diagram illustrating the example RRAM device 703 shown in FIG. 7 in accordance with some embodiments. In the illustrated example, as mentioned above, the RRAM device 703 includes the bottom electrode 706, the switching layer 705, and two isolated top electrodes 830a and 830b. In the example shown in FIG. 7 and FIG. 8, the RRAM device 703 is formed between the M3 and M4 metallization layers 718. In other words, the bottom electrode 706 is connected to a metal feature in the M3 metallization layer 118, whereas the two isolated top electrodes 830a and 830b are connected to metal features 707a and 707b in the M4 metallization layer 718, respectively, as shown in FIG. 7. It should be noted that, in other examples, the RRAM device 703 may be formed between another adjacent pair of metallization layers 718, such as between the M4 and M5 metallization layers 718, or elsewhere within integrated circuit device 700.

The bottom electrode 706 is disposed in a first dielectric layer 802, whereas the switching layer 705 is disposed in a second dielectric layer 804. The two isolated top electrodes 830a and 830b are disposed in a third dielectric layer 824. In one embodiment, the third dielectric layer 824 is made of silicon dioxide. It should be noted that the third dielectric layer 824 made of low-κ materials are within the scope of the disclosure. The top electrode 830a is situated between the left region 824a and the isolation region 824c of the third dielectric layer 824 in a horizontal direction (i.e., the X direction as shown in FIG. 8). The top electrode 830b is situated between the right region 824b and the isolation region 824c of the third dielectric layer 824 in the X direction. The isolation region 824c is between the left region 824a and the right region 824b. In other words, there are two openings in the third dielectric layer 824.

An oxygen-rich dielectric layer 828 is over the third dielectric layer 824. The oxygen-rich dielectric layer 828 is a layer with a relatively high concentration of oxygen ions. In one embodiment, the oxygen-rich dielectric layer 828 has a concentration of oxygen ions higher than a threshold concentration. The oxygen-rich dielectric layer 828 is sandwiched between the third dielectric layer 824 and the top electrode layer 830. Due to the existence of the two openings in the third dielectric layer 824, the oxygen-rich dielectric layer 828 has four spacer-like structures (also referred to as "dummy spacers") 828a, 828b, 828c, and 828d. In the illustrated example shown in FIG. 8, the dummy spacers 828a and 828b have round corners 826a and 826b, respectively, whereas the dummy spacers 828c and 828d have round corners 826c and 826d, respectively. The dummy spacers 828a and 828b are facing toward each other. The dummy spacers 828c and 828d are facing toward each other. As a result, a tapered recess 1012a is created by the dummy spacers 828a; a tapered recess 1012b is created by the dummy spacers 828c and 828d. In other words, the recesses 1012a and 1012b diminish in width in the X direction as it extends downwardly in the vertical direction (i.e., the Y direction as shown in FIG. 8). In one embodiment, each of the recesses 1012a and 1012b has a needle-like shape.

The top electrode 830a fills the tapered recess 1012a; the top electrode 830b fills the tapered recess 1012b. Accordingly, the top electrode 830a is tapered and has a tip 831a; the top electrode 830b is tapered and has a tip 831b. In other words, the top electrode 830a tapers to the tip 831a; the top electrode 830b tapers to the tip 831b. The tips 831a and 831b are pointing toward the switching layer 705. In one embodiment, the tips 831a and 831b are located at the interface 1020 between the third dielectric layer 824 and the switching layer 705. In another embodiment, the tips 831a and 831a are located above the interface 1020.

An isolation wall 1016 is located over the isolation region 824c of the third dielectric layer 824. The isolation wall 1016 is located between the top electrode 830a and the top electrode 830b and between the dummy spacer 828b and the dummy spacer 828c. The isolation wall 1016 is made of a dielectric, therefore separating the top electrode 830a and the dummy spacer 828b from the top electrode 830b and the dummy spacer 828c. The isolation wall 416 and the isolation region 824c together serve as an isolation structure 860, which isolates the top electrode 830a and the top electrode 830b. Thus, as mentioned above, the RRAM device 703 can be regarded as two separate RRAM devices 703a and 703b that share the bottom electrode 706. The first RRAM device 703a includes the bottom electrode 706, the switching layer 705, the top electrode 830a, and the oxygen-rich dielectric layer 828e (i.e., the left half of the oxygen-rich dielectric layer 828). Likewise, the second RRAM device 703b includes the bottom electrode 706, the switching layer 705, the top electrode 830a, and the oxygen-rich dielectric layer 828e (i.e., the left half of the oxygen-rich dielectric layer 828). In the illustrated example shown in FIG. 7, the electrode 830a is connected to the first bit line BL1, and the electrode 830b is connected to the second bit line BL2.

Due to the tapered shape of the top electrode 830a, a point discharge occurs when the filament 812a is formed by applying a forming voltage ($V_{forming}$) to the top electrode 830a through the first bit line BL1 shown in FIG. 7. Likewise, due to the tapered shape of the top electrode 830b, a point discharge occurs when the filament 812b is formed by applying a forming voltage ($V_{forming}$) to the top electrode 830b through the second bit line BL1 shown in FIG. 7. In other words, the resistance states of the first RRAM device 703a and the second RRAM device 703b can be switched independently.

In the illustrated example shown in FIG. 8, the filaments 812a and 812b correspond to the remaining oxygen vacancies 810. Since each of the tips 831a and 831b has a large curvature, the electrical fields around the tips 831a and 831b are larger than that of a conventional top electrode, given the same voltage. As a result, it becomes easier to break down the switching layer 705 to form the filaments 812a and 812b. In other words, it becomes easier to form the filaments 812a and 812b between the tips 831a and 831b and the bottom electrode 706 than between a conventional electrode, which is a flat electrode, and the bottom electrode 706. Accordingly, the formation of the filaments 812a and 812b is more predictable and controllable. As a result, the endurance and data retention in the RRAM device 703 is improved significantly.

Also, since the resistance states of the first RRAM device 703a and the second RRAM device 703b can be switched independently, two bits instead of one bit of information can be stored in the RRAM device 703, which increases the areal density of the RRAM device 703. Given the same storage capacity, the chip area of an RRAM chip including RRAM devices 703 arranged in rows and columns is smaller, thus reducing the fabrication cost of the RRAM chip. The reduced fabrication cost makes the RRAM technologies, which bear the advantages such as fast switching speed and better endurance, more accessible and affordable.

It should be noted that although two isolated top electrodes 830a and 830b are described above with reference to FIG. 8, multiple isolated top electrodes are within the scope of the disclosure. In one example, the RRAM device 703 includes three isolated top electrodes. In another example, the RRAM device 703 includes four isolated top electrodes.

On the other hand, the oxygen-rich dielectric layer 828 is a layer with a relatively high concentration of oxygen ions. In one embodiment, the oxygen-rich dielectric layer 828 has a concentration of oxygen ions higher than a threshold concentration. In one embodiment, the oxygen-rich dielectric layer 828 has a concentration of oxygen ions higher than that of the switching layer 705, if the oxygen-rich dielectric layer 828 and the switching layer 705 are made of the same material. As such, the oxygen-rich dielectric layer 828 can have enough oxygen ions to compensate for the loss of oxygen ions after frequent switching operations. The high concentration of oxygen ions makes the oxygen-rich dielectric layer 828 a good compensation source for the loss of oxygen ions after frequent switching operations. Additionally, since the switching layer 105 is shared by the first RRAM device 703a and the second RRAM device 703b, the oxygen-rich dielectric layer 828e (i.e., the left half of the oxygen-rich dielectric layer 828) and the oxygen-rich dielectric layer 828f (i.e., the right half of the oxygen-rich dielectric layer 228) can back each other up. When the oxygen-rich dielectric layer 828e is running low on oxygen ions, the oxygen-rich dielectric layer 828f can supply more oxygen ions than oxygen-rich dielectric layer 828e does; when the oxygen-rich dielectric layer 828f is running low on oxygen ions, the oxygen-rich dielectric layer 828e can supply more oxygen ions than oxygen-rich dielectric layer 828f does. Accordingly, the endurance and the data retention of the RRAM device 703 are improved significantly.

As shown in FIG. 8, the top electrode 830a of the first RRAM device 703a has a width a' (measured at the top surface of the third dielectric layer 824) in the X direction; the top electrode 830b of the second RRAM device 703b has a width b' (measured at the top surface of the third dielectric layer 824) in the X direction; the switching layer 705 has a height c' in the Y direction; the top surface of the bottom electrode 706 has a width d' in the X direction; the top surface of the oxygen-rich dielectric layer 828 has a height e' in the Y direction; the left region 824a and the isolation region 824c of the third dielectric layer 824 has a distance g' in the X direction; the right region 824b and the isolation region 824c of the third dielectric layer 824 has a distance h' in the X direction; the isolation wall 1016 has a width f' in the X direction.

In one embodiment, e' is equal to or larger than 0.5 nanometers. In one embodiment, the relationship between e' and d' is $0.001d' \le e' < d'$. In one embodiment, the relationship between e' and a' is $0.001a' \le e' < a'$. In one embodiment, the relationship between e' and b' is $0.001b' \le e' < b'$. In one embodiment, the relationship between a' and d' is $0.001d' \le a' < d'$. In another embodiment, the relationship between a' and d' is $0.001d' \le a' < 0.2d'$. In one embodiment, the relationship between b' and d' is $0.001d' \le b' < d'$. In another embodiment, the relationship between b' and d' is $0.001d' \le b' < 0.2d'$. In one embodiment, the relationship between c' and a' is $c' \ge 0.001a'$. In one embodiment, the relationship between c' and b' is $c' \ge 0.001b'$. In one embodiment, the relationship between c' and d' is $c' \ge 0.001d'$. In one embodiment, the relationship between f' and d' is $f' \ge 0.001d'$. In one embodiment, the relationship between g' and d' is $g' \ge 0.001d'$. In one embodiment, the relationship between h' and d' is $h' \ge 0.001d'$. As will be explained below, if $g' \ne h'$, then $a' \ne b'$.

Figure 9:
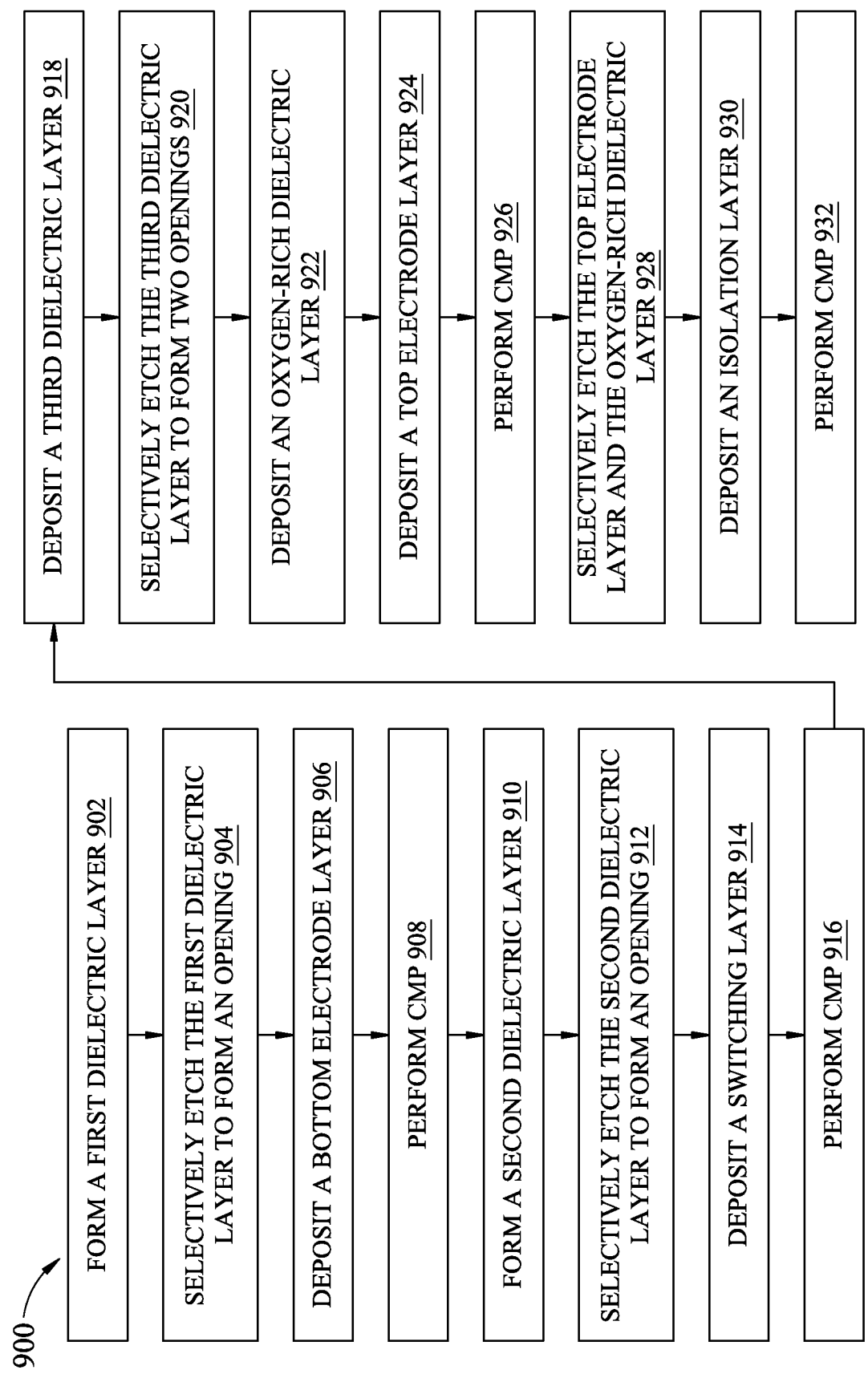
FIG. 9 is a diagram illustrating an example method of fabricating an RRAM device in accordance with some embodiments.

FIG. 9 is a diagram illustrating an example method 900 of fabricating an RRAM device in accordance with some embodiments. FIGS. 10A-10I are diagrams illustrating cross-sectional views of an RRAM device 1000 at various fabrication stages in accordance with some embodiments. In some embodiments, the RRAM device 1000 may be included in a microprocessor, memory cell, and/or other integrated circuits. Also, FIGS. 10A-10I are simplified for a better understanding of the concepts of the present disclosure. For example, although FIGS. 10A-10I illustrate the RRAM device 1000, it is understood the integrated circuit, in which the RRAM device 1000 is formed, may include a number of other devices including resistors, capacitors, inductors, fuses, and the like, which are not shown in FIGS. 10A-10I, for purposes of clarity of illustration.

The method 900 starts at operation 902. At operation 902, a first dielectric layer is formed. In one embodiment, a first dielectric layer is formed over a substrate. In another embodiment, a first dielectric layer is formed over a metallization layer. In the example shown in FIG. 10A, a first dielectric layer 802 is formed over a metallization layer 718 (e.g., a M3 metallization layer 718). The metallization layer 718 has a metal feature 707. The metal feature 707 is made of metal such as copper or aluminum. In some embodiments, the first dielectric layer 802 comprises silicon nitride (SiN), silicon carbide (SiC), or a similar composite dielectric film. In some embodiments, the first dielectric layer 802 may be formed by a deposition technique (e.g., physical vapor deposition (PVD), chemical vapor deposition (CVD), plasma-enhanced CVD (PECVD), atomic layer deposition (ALD), sputtering, etc.) to a predetermined thickness range.

The method 900 then proceeds to operation 904. At operation 904, the first dielectric layer is selectively etched to form an opening. In the example shown in FIG. 10A, an opening 1002 is formed in the first dielectric layer 802, and the opening 1002 is above the metal feature 707. As a result, a portion of the metal feature 707 is exposed. In one implementation, the opening 1002 is formed by etching areas of the first dielectric layer 802 that are left exposed by a photoresist mask. In other implementations, the opening is formed by etching areas of the first dielectric layer 802 that are left exposed by a hard mask such as a nitride hard mask. In some implementations, the first dielectric layer 802 is selectively etched by wet etching. In other implementations, the first dielectric layer 802 is selectively etched by dry etching. In yet other implementations, the first dielectric layer 802 is selectively etched by plasma etching.

The method 900 then proceeds to operation 906. At operation 906, a bottom electrode layer is deposited. In one implementation, the bottom electrode layer is deposited using PVD. In one embodiment, the bottom electrode layer is made of a metal such as titanium (Ti), tantalum (Ta), aluminum (Al), copper (Cu), and tungsten (W). In another embodiment, the bottom electrode layer is made of a metal alloy such as an aluminum-copper (AlCu) alloy.

The method 900 then proceeds to operation 908. At operation 908, a chemical-mechanical planarization (CMP) process is performed. The CMP process is performed on the bottom electrode layer until the first dielectric layer is also polished out (i.e., exposed). In the example shown in FIG. 10B, the CMP process removes the portion of the bottom electrode layer that is outside the opening 1002. Since the first dielectric layer 1002 is polished out, the bottom electrode 706 is formed in the opening 1002.

The method then proceeds to operation 910. At operation 910, a second electric layer is formed over the first dielectric layer. In some embodiments, the second electric layer and the first electric layer are made of the same material. In other embodiments, the second electric layer and the first electric layer are made of different materials. In some embodiments, the second dielectric layer comprises silicon nitride (SiN), silicon carbide (SiC), or a similar composite dielectric film. In some embodiments, the second dielectric layer may be formed by a deposition technique (e.g., PVD, CVD, PECVD, ALD, sputtering, etc.) to a predetermined thickness range.

The method 900 then proceeds to operation 912. At operation 912, the second dielectric layer is selectively etched to form an opening. In the example shown in FIG. 10C, an opening 1004 is formed in the second dielectric layer 804, and the opening 1004 is above the bottom electrode 706. As a result, the entire bottom electrode 706 is exposed. In one implementation, the opening 1004 is formed by etching areas of the second dielectric layer 804 that are left exposed by a photoresist mask. In other implementations, the opening is formed by etching areas of the second dielectric layer 804 that are left exposed by a hard mask such as a nitride hard mask. In some implementations, the second dielectric layer 804 is selectively etched by wet etching. In other implementations, the second dielectric layer 804 is selectively etched by dry etching. In yet other implementations, the second dielectric layer 804 is selectively etched by plasma etching.

The method 900 then proceeds to operation 914. At operation 914, a switching layer is deposited. The switching layer is deposited using suitable techniques such as ALD and PVD. The switching layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like.

The method 900 then proceeds to operation 916. At operation 916, a CMP process is performed. The CMP process is performed on the switching layer until the second dielectric layer is also polished out (i.e., exposed). In the example shown in FIG. 10D, the CMP process removes the portion of the switching layer that is outside the opening 1004. Since the second dielectric layer 804 is polished out, the switching layer 705 is formed in the opening 1004.

The method 900 then proceeds to operation 918. At operation 918, a third dielectric layer is deposited. In one embodiment, the third dielectric layer is a silicon dioxide layer. It should be noted that other dielectric can be used in other embodiments. In one embodiment, the third dielectric layer is deposited using PECVD. In another embodiment, the third dielectric layer is deposited using thermal CVD. In yet another embodiment, the third dielectric layer is deposited using ALD.

The method 900 then proceeds to operation 920. At operation 920, the third dielectric layer is selectively etched to form two openings. In the example shown in FIG. 10E, two openings 1006a and 1006b are formed in the third dielectric layer 824, and the openings 1006a and 1006b are above the switching layer 705. As a result, a portion of the switching layer 705 is exposed. The opening 1006a is located between the left region 824a and the isolation region 824c of the third dielectric layer 824; the opening 1006b is located between the right region 824b and the isolation region 824c of the third dielectric layer 824. In one implementation, the opening 1006 is formed by etching areas of the third dielectric layer 824 that are left exposed by a photoresist mask. In other implementations, the opening is formed by etching areas of the third dielectric layer 824 that are left exposed by a hard mask such as a nitride hard mask. In some implementations, the third dielectric layer 824 is selectively etched by wet etching. In other implementations, the third dielectric layer 824 is selectively etched by dry etching. In yet another implementation, the third dielectric layer 824 is selectively etched by plasma etching.

The method 900 then proceeds to operation 922. At operation 922, an oxygen-rich dielectric layer is deposited. In some implementations, the oxygen-rich dielectric layer is deposited using CVD. In other implementations, the oxygen-rich dielectric layer is deposited using ALD. The oxygen-rich dielectric layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like.

In the example shown in FIG. 10F, because of the openings 1006a and 1006b, the oxygen-rich dielectric layer 828 includes the dummy spacers 828a and 828b in the opening 1006a and the dummy spacers 828c and 828d in the opening 1006b. The dummy spacers 828a and 828b have round corners 826a and 826b, respectively, and are facing toward each other. The dummy spacers 828c and 828d have round corners 826c and 826d, respectively, and are facing toward each other. As a result, a tapered recess 1012a is formed at the location of the opening 1006a; a tapered recess 1012b is formed at the location of the opening 1006b. The tapered recess 1012a is defined by the round corners 826a and 826b; the tapered recess 1012b is defined by the round corners 826c and 826d.

As will be described below with reference to FIGS. 4G-4I, the tapered recesses 412a and 412b will be filled with the top electrode layer to form respective top electrodes. The oxygen-rich dielectric layer 828 also includes a portion 828g over the isolation region 824c of the third dielectric layer 824 and between the dummy spacers 828b and 828c. As will be described below with reference to FIG. 10H, the portion 828g will be etched.

In one embodiment, the width g' of the opening 1006a in the X direction and the height of the oxygen-rich dielectric layer 828 in the Y direction are chosen such that the dummy spacers 828a and 828b are in contact with each other at the bottom. In other words, there is no gap in the X direction between the dummy spacers 828a and 828b. Likewise, the width h' of the opening 1006b in the X direction and the height of the oxygen-rich dielectric layer 828 in the Y direction are chosen such that the dummy spacers 828c and 828d are in contact with each other at the bottom. In other words, there is no gap in the X direction between the dummy spacers 828c and 828d.

In some embodiments, the width h' and the width g' are the same. In other embodiments, the width h' and the width g' are different. It should be appreciated that if the width h' and the width g' are the same, the geometries of the tapered recess 1012a and the geometries of the tapered recess 1012b are the same, therefore the top electrodes formed later, which fill the recesses 1012a and 1012b, have the same geometries.

The method 900 then proceeds to operation 924. At operation 924, a top electrode layer is deposited. In one implementation, the top electrode layer is deposited using PVD. In one embodiment, the top electrode layer is made of a metal such as titanium (Ti), tantalum (Ta), aluminum (Al), copper (Cu), and tungsten (W). In another embodiment, the top electrode layer is made of a metal alloy such as an aluminum-copper (AlCu) alloy.

The method 900 then proceeds to operation 926. At operation 926, a CMP process is performed. The CMP process is performed on the top electrode layer. In some embodiments, the CMP process is performed on the top electrode layer until the height of the top electrode layer in the Y direction is close to a target height. In some embodiments, the CMP process is performed on the top electrode layer until the width of the top electrode of the first RRAM device and the width of the top electrode of the second RRAM device are close to a target width.

Figure 10B:
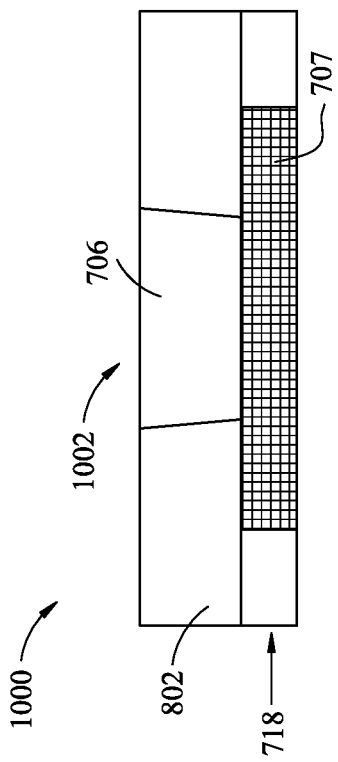
Figure 10A:
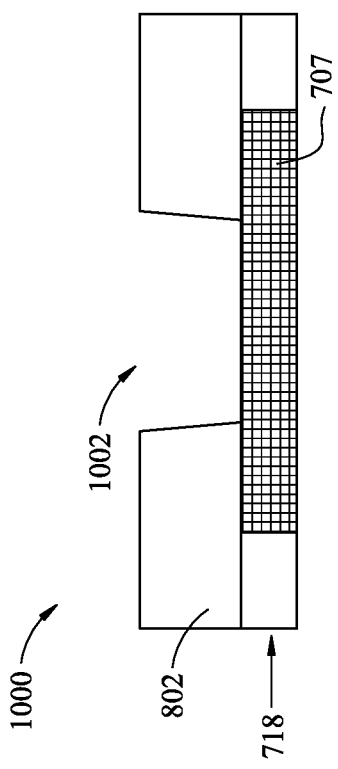
Figures 10G, 10H:
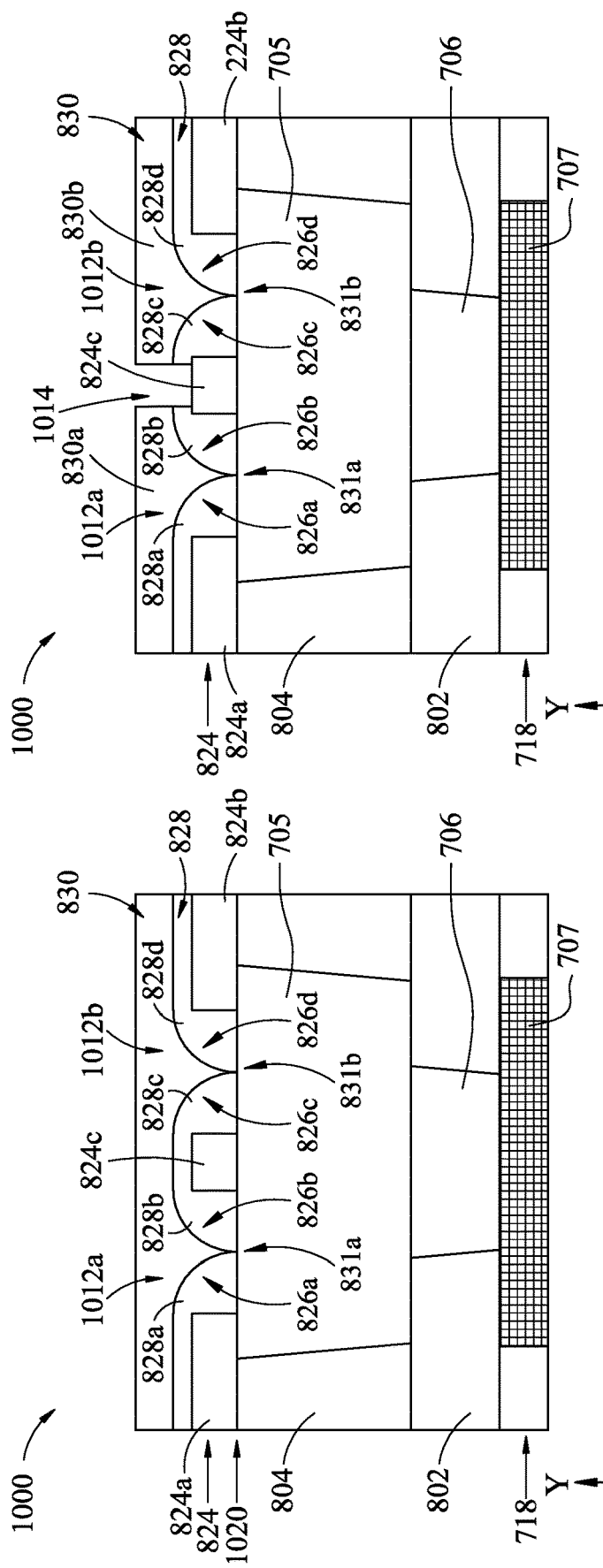
Figure 10I:
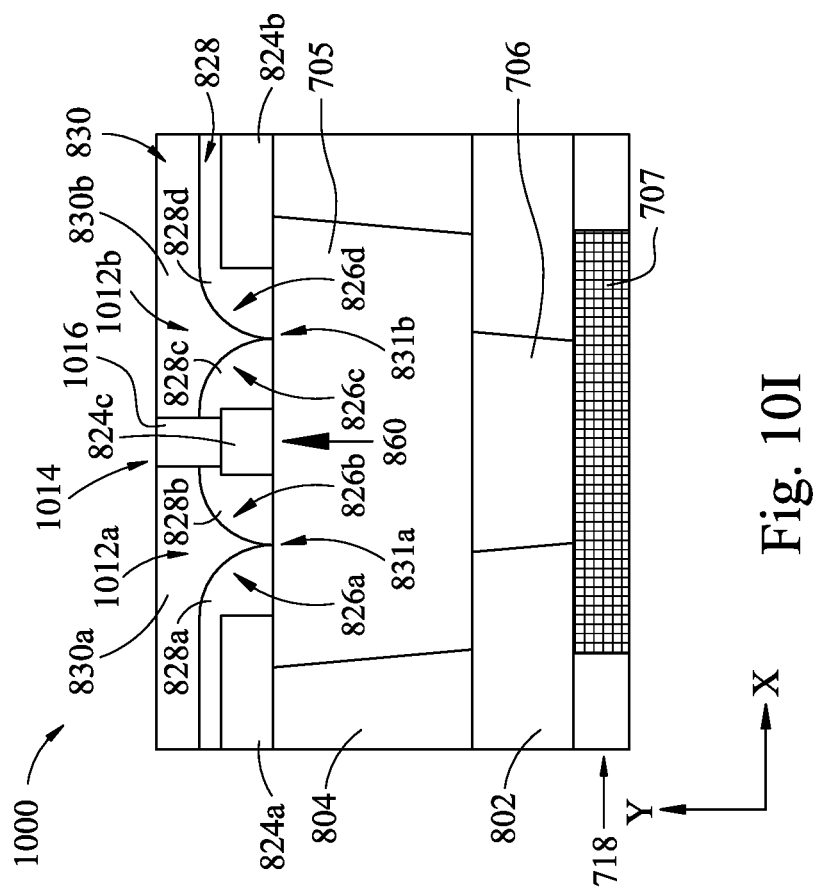

In the example shown in FIG. 10G, the top electrode layer 830 fills the tapered recess 1012a and 1012b. Accordingly, two tips 831a and 831b of the top electrode layer 830 are formed in the recesses 1012a and 1012b, respectively. In one embodiment, the tips 831a and 831b are located at the interface 1020 between the third dielectric layer 824 and the switching layer 705.

The method 900 then proceeds to operation 928. At operation 928, the top electrode layer and the oxygen-rich dielectric layer are selectively etched. In one implementation, the top electrode layer and the oxygen-rich dielectric layer are selectively etched using a dry etching process. In the illustrated example shown in FIG. 10H, the top electrode layer 830 and the oxygen-rich dielectric layer 828 are etched such that the top surface of the isolation region 824c of the third dielectric layer 824 is exposed in the opening 1014. In the illustrated example shown in FIG. 10H, the opening 1014 is located in the top electrode layer 830 and the oxygen-rich dielectric layer 828 and over the isolation region 824c. In other words, the opening 1014 separates the top electrode layer 830 and the oxygen-rich dielectric layer 828 in the middle in the X direction. It should be appreciated that the distance between the tips 831a and 831b in the X direction can be adjusted by adjusting the width of the isolation region 824c of the third dielectric layer 824 in the X direction. If the width of the isolation region 824c of the third dielectric layer 824 becomes larger, the distance between the tips 831a and 831b in the X direction becomes larger accordingly, therefore separating the filaments 812a and 812b shown in FIG. 8 more. If the width of the isolation region 824c of the third dielectric layer 824 becomes smaller, the distance between the tips 831a and 831b in the X direction becomes smaller accordingly, therefore separating the filaments 812a and 812b shown in FIG. 8 less.

In one implementation, the etch system is set in a detection mode, and the etching process at operation 928 stops when the third dielectric layer 824 is detected. In another implementation, the etch system is set in a detection mode followed by a time mode. In other words, the etching process at operation 928 stops after a predetermined time period since when the switching layer 705 is detected. As such, it can be ensured that no residual oxygen-rich dielectric layer 828 is left on the top surface of the isolation region 824c after the etching process at operation 928.

The method 900 then proceeds to operation 930. At operation 930, an isolation dielectric layer is deposited. The isolation dielectric layer fills the opening created after operation 928. As such, two tapered top electrodes are isolated, and their corresponding oxygen-rich dielectric layers are isolated as well. In some embodiments, the isolation dielectric layer is made of silicon nitride (SiN). In other embodiments, the isolation dielectric layer is made of silicon carbide (SiC). It should be noted that materials other than silicon nitride and silicon carbide may also be employed in other embodiments. In some embodiments, the isolation dielectric layer may be deposited using various deposition techniques such as PVD, CVD, PECVD, ALD, and the like.

The method 900 then proceeds to operation 932. At operation 932, a CMP process is performed. The CMP process is performed on the isolation dielectric layer until the top electrode layer is polished out (i.e., exposed). In the example shown in FIG. 10I, the CMP process removes the portion of the isolation dielectric layer that is outside the opening 1014. Since the top electrode layer 830 is polished out, an isolation wall 1016 is formed in the opening 1014. As mentioned above, the isolation wall 1016 is located between the top electrode 830a and the top electrode 830b and between the dummy spacer 828b and the dummy spacer 828c. The isolation wall 1016 and the isolation region 824c of the third dielectric layer 824 together serve as an isolation structure 860, which isolates the top electrode 830a and the top electrode 830b. Thus, the RRAM device 703 can be regarded as two separate RRAM devices 703a and 703b that share the bottom electrode 706. In some embodiments, the isolation wall 1016 and the isolation region 824c are made of the same material. In other embodiments, the isolation wall 1016 and the isolation region 824c are made of different materials.

Figure 11:
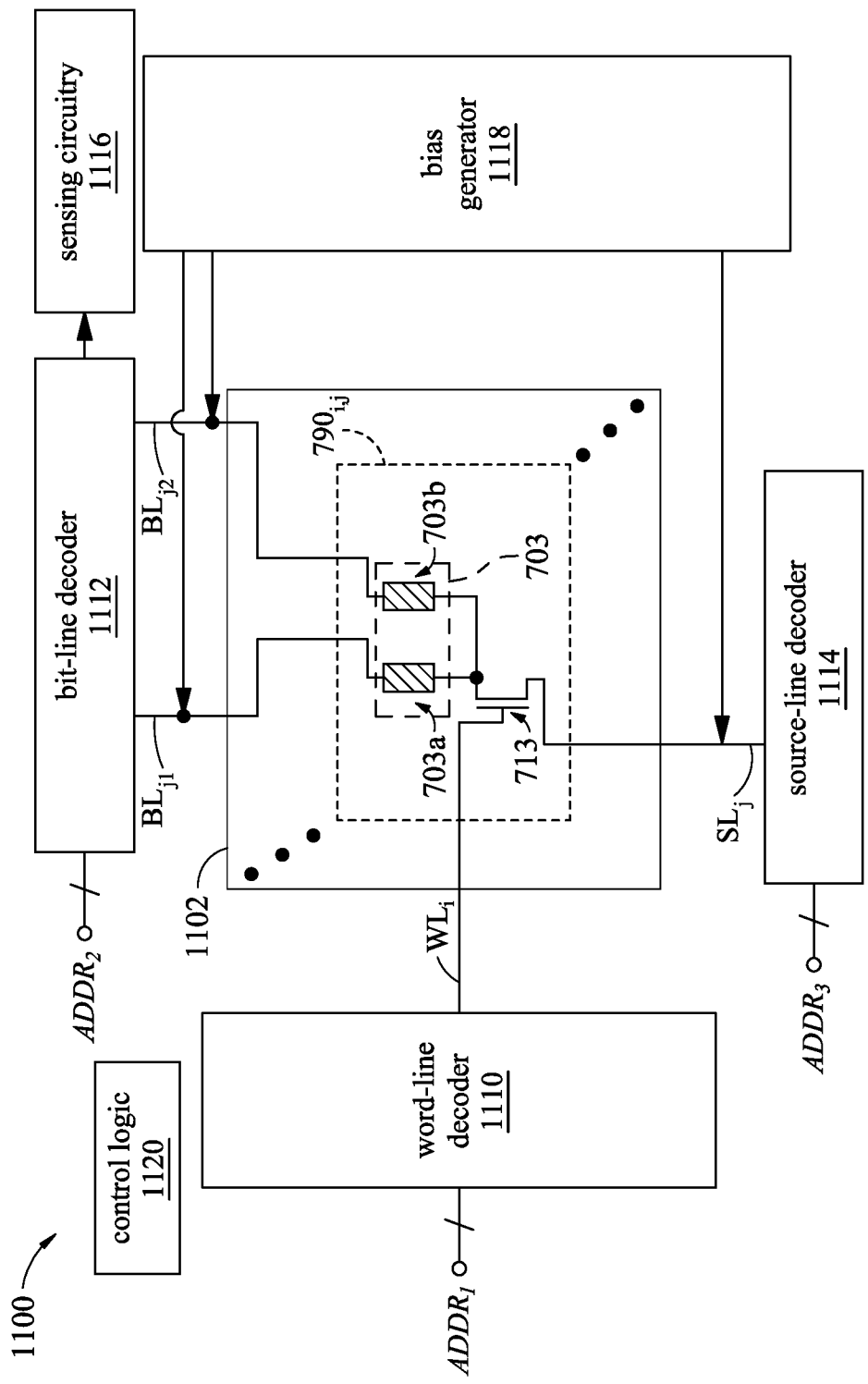
FIG. 11 is a diagram illustrating an example RRAM circuit having the RRAM cell shown in FIG. 1 in accordance with some embodiments.

FIG. 11 is a diagram illustrating an example RRAM circuit 1100 having the RRAM cell 790 shown in FIG. 7 in accordance with some embodiments. It should be noted that RRAM device 703 shown in FIG. 8 can also be used in various applications such as logic circuits, light-emitting diode (LED) circuits, liquid crystal display (LCD) circuits, CMOS image sensor (CIS) circuits, and the like.

In the illustrated example, the RRAM circuit 1100 includes, among other things, an RRAM cell array 1102, a word-line decoder 1110, a bit-line decoder 1112, a source-line decoder 1114, a sensing circuitry 1116, a bias generator 1118, and a control logic 1120. The RRAM cell array 1102 includes multiple RRAM cells $790_{i,j}$ like the one shown in FIG. 7, and the multiple RRAM cells 790 are arranged in multiple rows and multiple columns. Here, i is the row number, whereas j is the column number.

In the example shown in FIG. 11, the RRAM cell $790_{i,j}$ is operably coupled to the word line WL1 and the source line $SL_j$. The RRAM cell $790_{i,j}$ is also operably coupled to a pair of bit lines $BL_{j1}$ and $BL_{j2}$. The RRAM cell $790_{i,j}$ includes the RRAM device 703 as shown in FIG. 7 and FIG. 8 and an access transistor 713 as shown in FIG. 7. As described above, the RRAM device 703 can be regarded as the first RRAM device 703a and the second RRAM device 703b as shown in FIG. 8. The first terminal of the first RRAM device 703a is operably coupled to the bit line $BL_{j1}$, whereas the first terminal of the second RRAM device 703b is operably coupled to the bit line $BL_{j2}$. The second terminal of the first RRAM device 703a and the second terminal of the second RRAM device 703b are operably coupled to the access transistor 713. Therefore, the resistance state of the first RRAM device 703a and the resistance state of the first RRAM device 703b can be switched independently.

The first RRAM device 703a has a resistance state that is switchable between a low resistance state (LRS) and a high resistance state (HRS). Likewise, the second RRAM device 703b has a resistance state that is switchable between a low resistance state (LRS) and a high resistance state (HRS). The resistance states are indicative of a data value (e.g., a "1" or "0") stored within the RRAM device 703a or the RRAM device 703b. As such, two bits of information can be stored in the RRAM cell $790_{i,j}$.

By activating the word line $WL_i$, the access transistor 713 is turned on, allowing for the source line $SL_j$ to be coupled to the second terminal of the first RRAM device 703*a* and the second terminal of the second RRAM device 703*b*.

The RRAM cell array 1102 is coupled to support circuitry that is configured to read data from and/or write data to the plurality of RRAM cells 790$_{i,j}$. In some embodiments, the support circuitry comprises the word-line decoder 1110, the bit-line decoder 1112, the source-line decoder 1114, and the sensing circuitry 1116. The word-line decoder 1110 is configured to selectively apply a signal (e.g., a current and/or voltage) to one of the word lines WL$_i$ based upon a first address ADDR1; the bit-line decoder 1112 is configured to selectively apply a signal to one of the plurality pairs of bit lines BL$_{j1}$ and BL$_{j2}$ based upon a second address ADDR2; the source-line decoder 1114 is configured to selectively apply a signal to one of the plurality of source lines SL$_j$ based upon a third address ADDR3. In the illustrated example shown in FIG. 11, the second address ADDR2 and the third address ADDR3 may be the same.

By selectively applying signals to the word lines WL$_i$, the bit line pairs BL$_{j1}$ and BL$_{j2}$, and the source lines SL$_j$, the support circuitry is able to perform forming, set, reset, and read operations on selected ones of the plurality of RRAM cells 790$_{i,j}$. The sensing circuitry 1116 is configured to sense this signal and to determine the data state of the selected RRAM cell 790$_{i,j}$ based on the signal (e.g., by comparing a received voltage to a reference voltage).

The bias generator 1118 is configured to provide various bias voltages for different components of the RRAM circuit 1100. In the illustrated example, the bias generator 1118 generates bias voltages for the bit lines BL1 and BL2 and the source lines SL1 and SL2. The control logic 1120 is configured to control the functioning of the RRAM circuit 1100.

Figure 12:
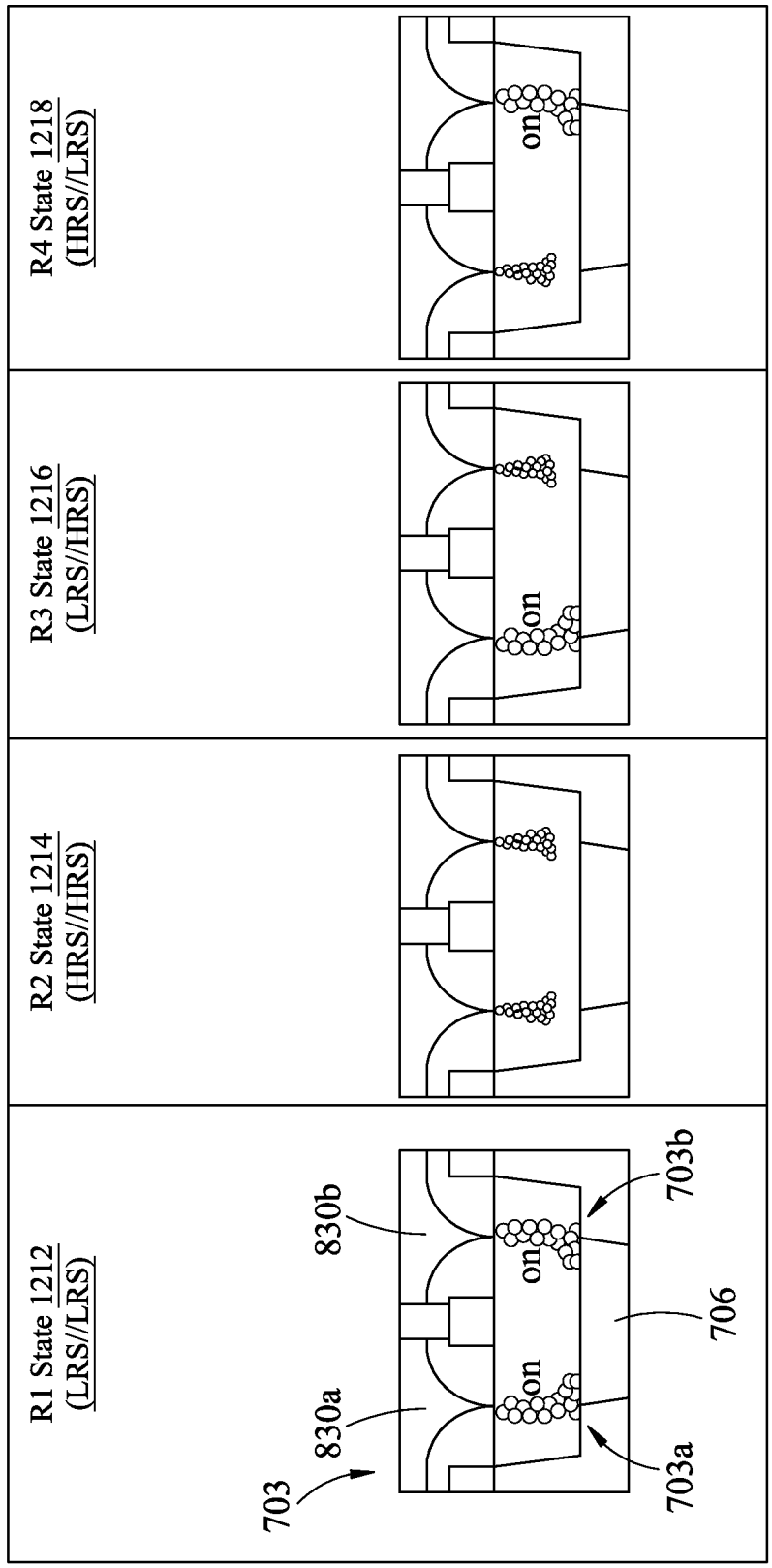
FIG. 12 is a diagram illustrating multiple resistance states of an example RRAM device in accordance with some embodiments.

FIG. 12 is a diagram illustrating multiple resistance states of an example RRAM device in accordance with some embodiments. In the illustrated example shown in FIG. 12, the RRAM device 703 includes the first RRAM device 703*a* and the second RRAM device 703*b*, which share the bottom electrode 706. In the R1 state 1112, both the first RRAM device 703*a* and the second RRAM device 703*b* have a low resistance state (LRS). The overall resistance is equivalent to a low resistance state in parallel with another low resistance state (denoted as "LRS//LRS"). In the R2 state 1214, both the first RRAM device 703*a* and the second RRAM device 703*b* have a high resistance state (HRS). The overall resistance is equivalent to a high resistance state in parallel with another high resistance state (denoted as "HRS//HRS"). In the R3 state 1216, the first RRAM device 703*a* has a low resistance state (LRS) while the second RRAM device 703*b* has a high resistance state (HRS). The overall resistance is equivalent to a low resistance state in parallel with a high resistance state (denoted as "LRS//HRS"). In the R4 state 1218, the first RRAM device 703*a* has a high resistance state (HRS) while the second RRAM device 703*b* has a low resistance state (LRS). The overall resistance is equivalent to a high resistance state in parallel with a low resistance state (denoted as "HRS//LRS").

In accordance with some aspects of the disclosure, a RRAM device is provided. The RRAM device includes: a bottom electrode in a first dielectric layer; a switching layer in a second dielectric layer over the first dielectric layer, wherein a conductive path is formed in the switching layer when a forming voltage is applied; and a tapered top electrode region in a third dielectric layer over the second dielectric layer, wherein the tapered top electrode region extends downwardly into the switching layer.

In accordance with some aspects of the disclosure, a method of fabricating a RRAM device is provided. The method includes the following steps: forming a bottom electrode in a first dielectric layer; forming a switching layer in a second dielectric layer over the first dielectric layer; forming a tapered recess located in a third dielectric layer over the second dielectric layer and extending downwardly into the switching layer; depositing an oxygen-rich dielectric layer over the tapered recess; and depositing a top electrode layer over the oxygen-rich dielectric layer In accordance with some aspects of the disclosure, A RRAM device is provided. The RRAM device includes: a bottom electrode in a first dielectric layer; a switching layer in a second dielectric layer over the first dielectric layer, wherein one or more conductive paths are formed in the switching layer when a forming voltage is applied; a first tapered top electrode in a third dielectric layer over the second dielectric layer; a second tapered top electrode in the third dielectric layer; and an isolation structure extending upward from a top surface of the switching layer and isolating the first tapered top electrode and the second tapered top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device comprising:
   a bottom electrode in a first dielectric layer;
   a switching layer in a second dielectric layer over the first dielectric layer, wherein a conductive path is formed in the switching layer when a forming voltage is applied; and
   a tapered top electrode region in a third dielectric layer over the second dielectric layer, wherein the tapered top electrode region extends downwardly into the switching layer, wherein the tapered top electrode region comprises:
      an oxygen-rich dielectric layer in contact with the switching layer and the third dielectric layer; and
      a top electrode over the oxygen-rich dielectric layer.

2. The RRAM device of claim 1, wherein the oxygen-rich dielectric layer comprises a tip of the oxygen-rich dielectric layer.

3. The RRAM device of claim 2, wherein the top electrode comprises a tip of the top electrode, and the tip of the top electrode is below an interface between the third dielectric layer and the switching layer.

4. The RRAM device of claim 1, wherein a first width of a top surface of the tapered top electrode region in a horizontal direction is smaller than a second width of a top surface of the bottom electrode.

5. The RRAM device of claim 1, wherein the oxygen-rich dielectric layer is over a tapered recess located in the third dielectric layer and extending downwardly into the switching layer.

6. The RRAM device of claim 5, wherein a thickness of the oxygen-rich dielectric layer is chosen based on a width of the tapered recess in a horizontal direction at an interface between the third dielectric layer and the switching layer.

7. The RRAM device of claim 1, wherein the oxygen-rich dielectric layer is made of a first oxidation material.

8. The RRAM device of claim 7, wherein the oxygen-rich dielectric layer has a concentration of oxygen ions higher than a threshold concentration.

9. The RRAM device of claim 7, wherein the oxygen-rich dielectric layer has a concentration of oxygen ions higher than a concentration of oxygen ions in the switching layer.

10. The RRAM device of claim 1, wherein the switching layer is made of a second oxidation material.

11. A resistive random access memory (RRAM) device comprising:
    a bottom electrode in a first dielectric layer;
    a switching layer in a second dielectric layer over the first dielectric layer, wherein one or more conductive paths are formed in the switching layer when a forming voltage is applied;
    a first tapered top electrode in a third dielectric layer over the second dielectric layer;
    a first oxygen-rich dielectric layer sandwiched between the switching layer and the first tapered top electrode;
    a second tapered top electrode in the third dielectric layer;
    a second oxygen-rich dielectric layer sandwiched between the switching layer and the second tapered top electrode; and
    an isolation structure extending upward from a top surface of the switching layer and isolating the first tapered top electrode and the second tapered top electrode, wherein the first oxygen-rich dielectric layer and the second oxygen-rich dielectric layer are isolated by the isolation structure.

12. The RRAM device of claim 11, wherein the first oxygen-rich dielectric layer has a first tapered recess, and the second oxygen-rich dielectric layer has a second tapered recess.

13. The RRAM device of claim 12, wherein the first oxygen-rich dielectric layer comprises a first dummy spacer and a second dummy spacer facing toward each other, and the second oxygen-rich dielectric layer comprises a third dummy spacer and a fourth dummy spacer facing toward each other.

14. The RRAM device of claim 12, wherein the first tapered top electrode comprises a first tip pointing toward the switching layer, and the second tapered top electrode comprises a second tip pointing toward the switching layer.

15. The RRAM device of claim 11, wherein the isolation structure comprises:
    an isolation region of the third dielectric layer over the switching layer; and
    an isolation wall over the isolation region of the third dielectric layer.

16. A resistive random access memory (RRAM) device comprising:
    a substrate;
    a bottom electrode in a first dielectric layer over the substrate;
    a switching layer in a second dielectric layer over the first dielectric layer, wherein a conductive path is formed in the switching layer when a forming voltage is applied; and
    a tapered top electrode region in a third dielectric layer over the second dielectric layer, wherein the tapered top electrode region extends downwardly into the switching layer, wherein the tapered top electrode region comprises:
        an oxygen-rich dielectric layer in contact with the switching layer and the third dielectric layer; and
        a top electrode over the oxygen-rich dielectric layer.

17. The RRAM device of claim 16, wherein the oxygen-rich dielectric layer comprises a tip of the oxygen-rich dielectric layer.

18. The RRAM device of claim 14, wherein the first tip is located in the first tapered recess, and the second tip is located in the second tapered recess.

19. The RRAM device of claim 11, wherein the first oxygen-rich dielectric layer and the second oxygen-rich dielectric layer have a first concentration of oxygen ions, the switching layer has a second concentration of oxygen ions, and the first concentration of oxygen ions is higher than the second concentration of oxygen ions.

20. The RRAM device of claim 11, wherein the first oxygen-rich dielectric layer and the second oxygen-rich dielectric layer comprise a first oxidation material, and the switching layer comprises a second oxidation material different from the first oxidation material.

* * * * *